United States Patent
Yu et al.

(10) Patent No.: US 12,250,845 B2
(45) Date of Patent: Mar. 11, 2025

(54) DISPLAY PANEL AND FORMATION METHOD THEREOF, AND DISPLAY APPARATUS

(71) Applicant: Hubei Yangtze Industrial Innovation Center of Advanced Display Co., LTD., Wuhan (CN)

(72) Inventors: Feng Yu, Wuhan (CN); Jun Yan, Wuhan (CN); Jiaxian Liu, Shanghai (CN)

(73) Assignee: Hubei Yangtze Industrial Innovation Center of Advanced Display Co., LTD., Wuhan (CN)

( * ) Notice: Subject to any disclaimer, the term of this patent is extended or adjusted under 35 U.S.C. 154(b) by 549 days.

(21) Appl. No.: 17/645,613

(22) Filed: Dec. 22, 2021

(65) Prior Publication Data

US 2022/0199959 A1  Jun. 23, 2022

(30) Foreign Application Priority Data

Dec. 22, 2020  (CN) .......................... 202011525887.8

(51) Int. Cl.
*H10K 50/86* (2023.01)
*H10K 50/125* (2023.01)
(Continued)

(52) U.S. Cl.
CPC ......... *H10K 50/865* (2023.02); *H10K 50/125* (2023.02); *H10K 50/84* (2023.02);
(Continued)

(58) Field of Classification Search
CPC .... H10K 59/40; H10K 59/8792; H10K 59/38; H10K 59/877; H01L 33/52; H01L 33/56; H01L 2933/0091
See application file for complete search history.

(56) References Cited

U.S. PATENT DOCUMENTS

| 12,063,845 B2 * | 8/2024 | Liu ..................... H10K 59/124 |
| 2014/0306260 A1 * | 10/2014 | Yamazaki ............. H10K 59/40 257/99 |

(Continued)

FOREIGN PATENT DOCUMENTS

| CN | 104350629 A | 2/2015 |
| CN | 109119453 A | 1/2019 |

(Continued)

*Primary Examiner* — Evren Seven
(74) *Attorney, Agent, or Firm* — Anova Law Group, PLLC

(57) ABSTRACT

A display panel and a formation method thereof, and a display apparatus are provided in the present disclosure. The method includes providing a base substrate; forming an array layer on a side of the base substrate; forming a light-emitting structure layer on a side of the array layer away from the base substrate, where the light-emitting structure layer includes a plurality of light-emitting units; and forming a light-blocking layer on a side of the light-emitting structure layer away from the base substrate, where the light-blocking layer includes a black matrix and openings. Before forming the openings, the method further includes forming a first inorganic layer between the light-emitting structure layer and the light-blocking layer, where the first inorganic layer at least includes first sub-portions; and a vertical projection of a first sub-portion on the base substrate overlaps a vertical projection of a corresponding opening on the base substrate.

14 Claims, 15 Drawing Sheets

(51) Int. Cl.
*H10K 50/84* (2023.01)
*H10K 50/854* (2023.01)
*H10K 59/38* (2023.01)
*H10K 59/40* (2023.01)

(52) U.S. Cl.
CPC .......... *H10K 50/854* (2023.02); *H10K 59/38* (2023.02); *H10K 59/40* (2023.02)

(56) References Cited

U.S. PATENT DOCUMENTS

| | | | | |
|---|---|---|---|---|
| 2014/0346493 | A1* | 11/2014 | Lee | H10K 50/865 |
| | | | | 257/40 |
| 2014/0354145 | A1* | 12/2014 | Fisher | H01L 33/54 |
| | | | | 313/512 |
| 2015/0255740 | A1* | 9/2015 | Nakada | H10K 59/871 |
| | | | | 257/40 |
| 2015/0311477 | A1* | 10/2015 | Cho | H10K 59/40 |
| | | | | 257/40 |
| 2015/0362776 | A1* | 12/2015 | Jikumaru | H10K 50/865 |
| | | | | 349/12 |
| 2016/0104869 | A1* | 4/2016 | Choi | H10K 59/122 |
| | | | | 257/40 |
| 2018/0095566 | A1* | 4/2018 | Lee | G06F 3/047 |
| 2021/0109617 | A1* | 4/2021 | Lin | H10K 59/38 |
| 2021/0200365 | A1* | 7/2021 | Lee | H10K 50/865 |

FOREIGN PATENT DOCUMENTS

| | | |
|---|---|---|
| CN | 109192758 A | 1/2019 |
| CN | 109407870 A | 3/2019 |
| CN | 109696986 A | 4/2019 |
| CN | 111312792 A | 6/2020 |
| CN | 111584594 A | 8/2020 |

\* cited by examiner

DISPLAY PANEL AND FORMATION METHOD THEREOF, AND DISPLAY APPARATUS

CROSS-REFERENCE TO RELATED APPLICATION

This application claims the priority of Chinese Patent Application No. 202011525887.8, filed on Dec. 22, 2020, the content of which is incorporated herein by reference in its entirety.

TECHNICAL FIELD

The present disclosure generally relates to the field of display technology and, more particularly, relates to a display panel and a formation method thereof, and a display apparatus.

BACKGROUND

Organic light-emitting diode (OLED) displays, as a new generation of display devices, have the advantages of being thin and light, high contrast, fast response, wide viewing angle, high brightness, full color, etc. Therefore, OLED displays have an extremely wide range of application prospects in the field of computers, personal digital assistants (PDA), digital cameras, car displays, notebook computers, wall-mounted TVs, military and the like.

In order to reduce the reflectivity of external light in the organic light-emitting diode display, one solution is to attach a circular polarizer to the light-exiting surface of the organic light-emitting diode display. However, about half of the light exited from the organic light-emitting diode display may be absorbed by the circular polarizer, thereby reducing the light output effect of the organic light-emitting diode display.

Another solution is to configure a color filter on the light-exiting surface of the organic light-emitting diode display. This configuration has a better effect of reducing the reflection of ambient light in the organic light-emitting diode display and improving the light-exiting effect of the organic light-emitting diode display.

However, when the color filter is configured on the light-exiting surface of the organic light-emitting diode display, the compatibility between the color filter and the film layer of the display becomes an urgent problem to be solved.

SUMMARY

One aspect of the present disclosure provides a formation method of a display panel. The method includes providing a base substrate; forming an array layer on a side of the base substrate; forming a light-emitting structure layer on a side of the array layer away from the base substrate, wherein the light-emitting structure layer includes a plurality of light-emitting units; forming a light-blocking layer on a side of the light-emitting structure layer away from the base substrate, wherein the light-blocking layer includes a black matrix and a plurality of openings; the black matrix is a grid-like structure surrounding the plurality of openings; the plurality of openings has a one-to-one correspondence with the plurality of light-emitting units; and a vertical projection of the plurality of openings on the base substrate overlaps a vertical projection of the plurality of light-emitting units corresponding to the plurality of openings on the base substrate; and before forming the plurality of openings, further including: forming a first inorganic layer between the light-emitting structure layer and the light-blocking layer, wherein the first inorganic layer at least includes first sub-portions; and a vertical projection of a first sub-portion on the base substrate overlaps a vertical projection of a corresponding opening on the base substrate.

Another aspect of the present disclosure provides a display panel. The display panel includes a base substrate; an array layer on a side of the base substrate; a light-emitting structure layer on a side of the array layer away from the base substrate, wherein the light-emitting structure layer includes a plurality of light-emitting units; a first inorganic layer on a side of the light-emitting structure layer away from the base substrate; and a light-blocking layer on a side of the first inorganic layer away from the base substrate. The light-blocking layer includes a black matrix and a plurality of openings; the black matrix is a grid-like structure surrounding the plurality of openings; the plurality of openings has a one-to-one correspondence with the plurality of light-emitting units; and a vertical projection of the plurality of openings on the base substrate overlaps a vertical projection of the plurality of light-emitting units corresponding to the plurality of openings on the base substrate. The first inorganic layer at least includes first sub-portions; and a vertical projection of a first sub-portion on the base substrate overlaps a vertical projection of a corresponding opening on the base substrate.

Another aspect of the present disclosure provides a display apparatus including a display panel. The display panel includes a base substrate; an array layer on a side of the base substrate; a light-emitting structure layer on a side of the array layer away from the base substrate, wherein the light-emitting structure layer includes a plurality of light-emitting units; a first inorganic layer on a side of the light-emitting structure layer away from the base substrate; and a light-blocking layer on a side of the first inorganic layer away from the base substrate. The light-blocking layer includes a black matrix and a plurality of openings; the black matrix is a grid-like structure surrounding the plurality of openings; the plurality of openings has a one-to-one correspondence with the plurality of light-emitting units; and a vertical projection of the plurality of openings on the base substrate overlaps a vertical projection of the plurality of light-emitting units corresponding to the plurality of openings on the base substrate. The first inorganic layer at least includes first sub-portions; and a vertical projection of a first sub-portion on the base substrate overlaps a vertical projection of a corresponding opening on the base substrate.

Other aspects of the present disclosure can be understood by those skilled in the art in light of the description, the claims, and the drawings of the present disclosure.

BRIEF DESCRIPTION OF THE DRAWINGS

The drawings incorporated in the specification and constituting a part of the specification illustrate various embodiments of the present disclosure, and together with the description are used to explain the principle of the present disclosure.

DETAILED DESCRIPTION

Figure 1:
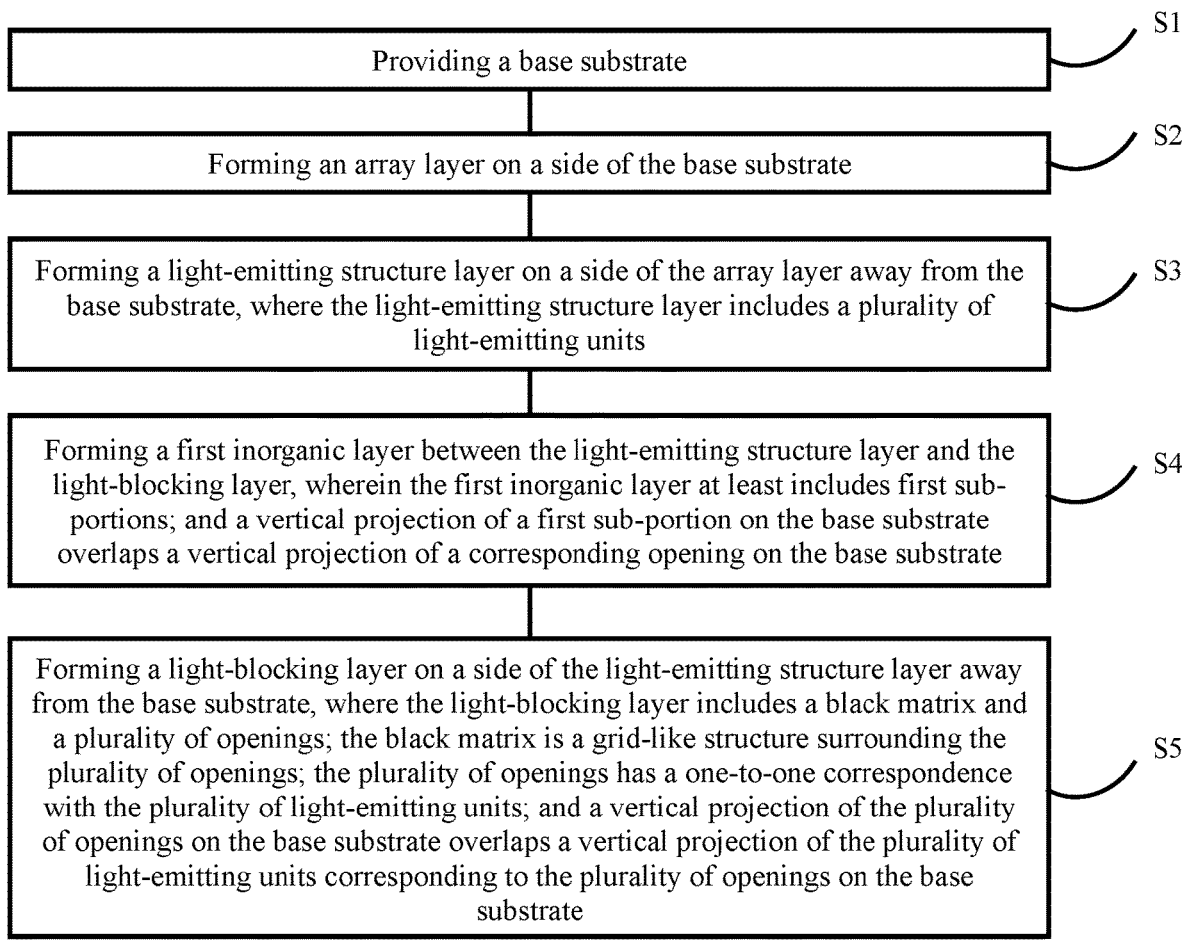
FIG. 1 illustrates a flowchart of a formation method of a display panel according to various embodiments of the present disclosure.

Various exemplary embodiments of the present disclosure are described in detail with reference to accompanying drawings. It should be noted that unless specifically stated otherwise, the relative arrangement, numerical expressions and numerical values of the components and steps described in these embodiments do not limit the scope of the present disclosure.

The following description of at least one exemplary embodiment is merely illustrative, and in no way serves as any limitation to the present disclosure and its application or use.

Techniques, methods, and equipment known to those skilled in the art may not be discussed in detail, but in appropriate cases, the techniques, methods, and equipment should be regarded as a part of the present disclosure.

In all examples shown and discussed herein, any specific value should be interpreted as merely exemplary, rather than as a limitation. Therefore, other examples of the exemplary embodiment may have different values.

It should be noted that similar reference numerals and letters indicate similar items in the following drawings. Therefore, once an item is defined in one drawing, it does not need to be further discussed in subsequent drawings.

In the existing technology, the color filter may be usually manufactured after the touch control layer is manufactured. In the manufacturing process of the color filter, a black photosensitive material may be coated on the organic adhesive layer in the touch control layer, and a black matrix may be formed by exposure and development. In the process of exposing and developing the black photosensitive material, a large area of the black photosensitive material may remain in the opening region of the black matrix, which may affect the subsequent manufacturing process of the color filter and affect the display quality of the display panel.

Figure 2:
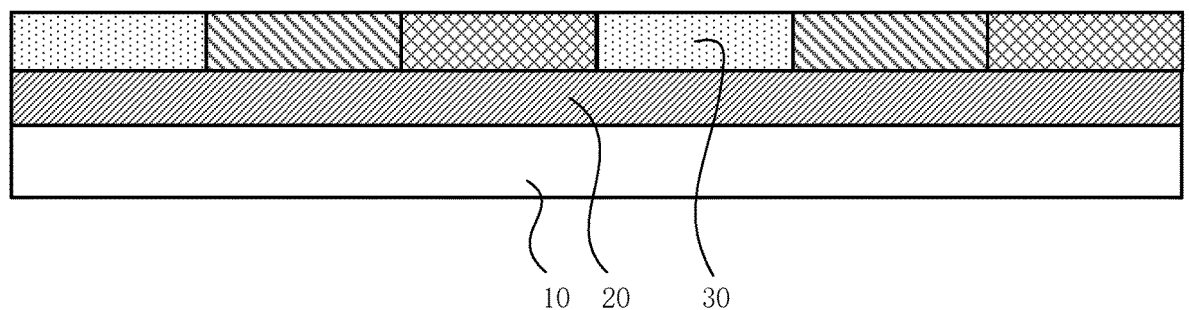
FIGS. 2-3 illustrate structural schematics of the display panel corresponding to the formation method illustrated in FIG. 1.
Figure 3:
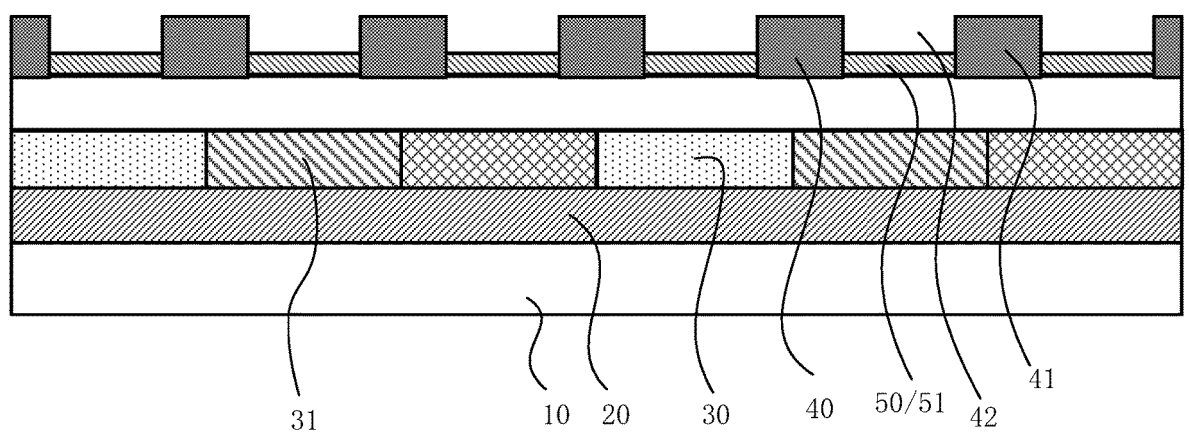

FIG. 1 illustrates a flowchart of a formation method of a display panel according to various embodiments of the present disclosure; and FIGS. 2-3 illustrate structural schematics of the display panel corresponding to the formation method illustrated in FIG. 1. Referring to FIGS. 1-3, a formation method of a display panel may be provided in one embodiment. The method may include the following.

At S1, a base substrate may be provided.

At S2, an array layer may be formed on the side of the base substrate.

At S3, a light-emitting structure layer may be formed on the side of the array layer away from the base substrate, and the light-emitting structure layer may include a plurality of light-emitting units.

Referring to FIG. 2, a base substrate 10 may be provided. The base substrate 10 may be a rigid substrate, for example, a glass substrate. The base substrate 10 may also be a flexible substrate, for example, a polyimide substrate. An array layer 20 and a light-emitting structure layer 30 may be sequentially formed on the side of the base substrate 10. The light-emitting structure layer 30 may include a plurality of light-emitting units 31. The array layer 20 may include various functional film layers related to pixel drive circuits for driving the light-emitting units 31 to emit light. The pixel drive circuits may include thin film transistors, storage capacitors, and other circuit elements known to those skilled in the art. Exemplarily, taking the thin film transistor as an example, the array layer may include an active layer, a gate electrode insulating layer, a gate electrode layer, an interlayer insulating layer, a source/drain electrode layer, and other layers known to those skilled in the art. The plurality of light-emitting units 31 may be formed in the light-emitting structure layer 30. The light-emitting units 31 may be used for emitting light to display a picture to be displayed. Exemplarily, the light-emitting unit 31 may be an organic light-emitting unit, a liquid crystal display light-emitting unit, a Mini-LED, a Micro-LED, or other types of light-emitting units known to those skilled in the art.

At S5, a light-blocking layer may be formed on the side of the light-emitting structure layer away from the base substrate. The light-blocking layer may include a black matrix and a plurality of openings; the black matrix may be a grid-like structure surrounding the plurality of openings, and the openings may have a one-to-one correspondence with the light-emitting units; and the vertical projection of the opening on the base substrate may overlap the vertical projection of the light-emitting unit corresponding to the opening on the base substrate.

Before forming the openings of the light-blocking layer at S5, the method may further include S4 where the first inorganic layer may be formed between the light-emitting structure layer and the light-blocking layer. The first inorganic layer may include at least first sub-portions; and the vertical projection of the first sub-portion on the base substrate may overlap the vertical projection of the opening on the base substrate.

Referring to FIG. 3, a light-blocking layer 40 may be formed on the side of the light-emitting structure layer 30 away from the base substrate 10; the light-blocking layer 40 may include a black matrix 41 and a plurality of openings 42; the black matrix 41 may be a grid-like structure surrounding the plurality of openings 42; the plurality of openings 42 may have a one-to-one correspondence with the light-emitting units 30; the vertical projection of the opening 42 on the base substrate 10 may overlap the vertical projection of the corresponding light-emitting unit 31 on the base substrate 10; and the light emitted from the light-emitting unit 31 may be emitted through the opening 42.

Before forming the light-blocking layer 40 on the side of the light-emitting structure layer 30 away from the base substrate 10, the first inorganic layer 50 may be formed on the side of the light-emitting structure layer 30 away from the base substrate 10. The first inorganic layer 50 may include the first sub-portions 51. The vertical projection of the first sub-portion 51 on the base substrate 10 may overlap the vertical projection of the opening 42 in the light-blocking layer 40 on the base substrate 10 in the subsequent S5. At S5, the black matrix 41 with a grid structure surrounding the plurality of openings 42 may be formed in the light-blocking layer 40, which may be that a black photosensitive resin layer may be coated on the surface of the first inorganic layer 50 on the side away from the base substrate 10, and the black matrix 41 with a grid structure surrounding the plurality of openings 42 may be formed by exposure and development. The vertical projection of the first sub-portion 51 on the base substrate 10 overlaps the vertical projection of the opening 42 in the light-blocking layer 40 on the base substrate 10 in the subsequent S5; that is, the portion of the black photosensitive resin layer where the opening 42 is subsequently formed may be attached to the first sub-portion 51. Therefore, the first sub-portion 51, made of inorganic material, may have a relatively small adhesion with the black photosensitive resin material, which may effectively avoid the problem that the portion of the black photosensitive resin layer for subsequently forming the opening 42 cannot be completely removed in the subsequent development process, and the black photosensitive resin material portion may partially remain in the opening 42. Therefore, the black photosensitive resin material remaining in the opening 42 may be prevented from affecting the subsequent manufacturing process, and the display quality of the display panel may be effectively improved.

It should be noted that the display panel in one embodiment may also include a cover plate, an optical adhesive, a thin film encapsulation layer, and other film layers known to those skilled in the art, which may not be described in detail herein.

Figure 4:
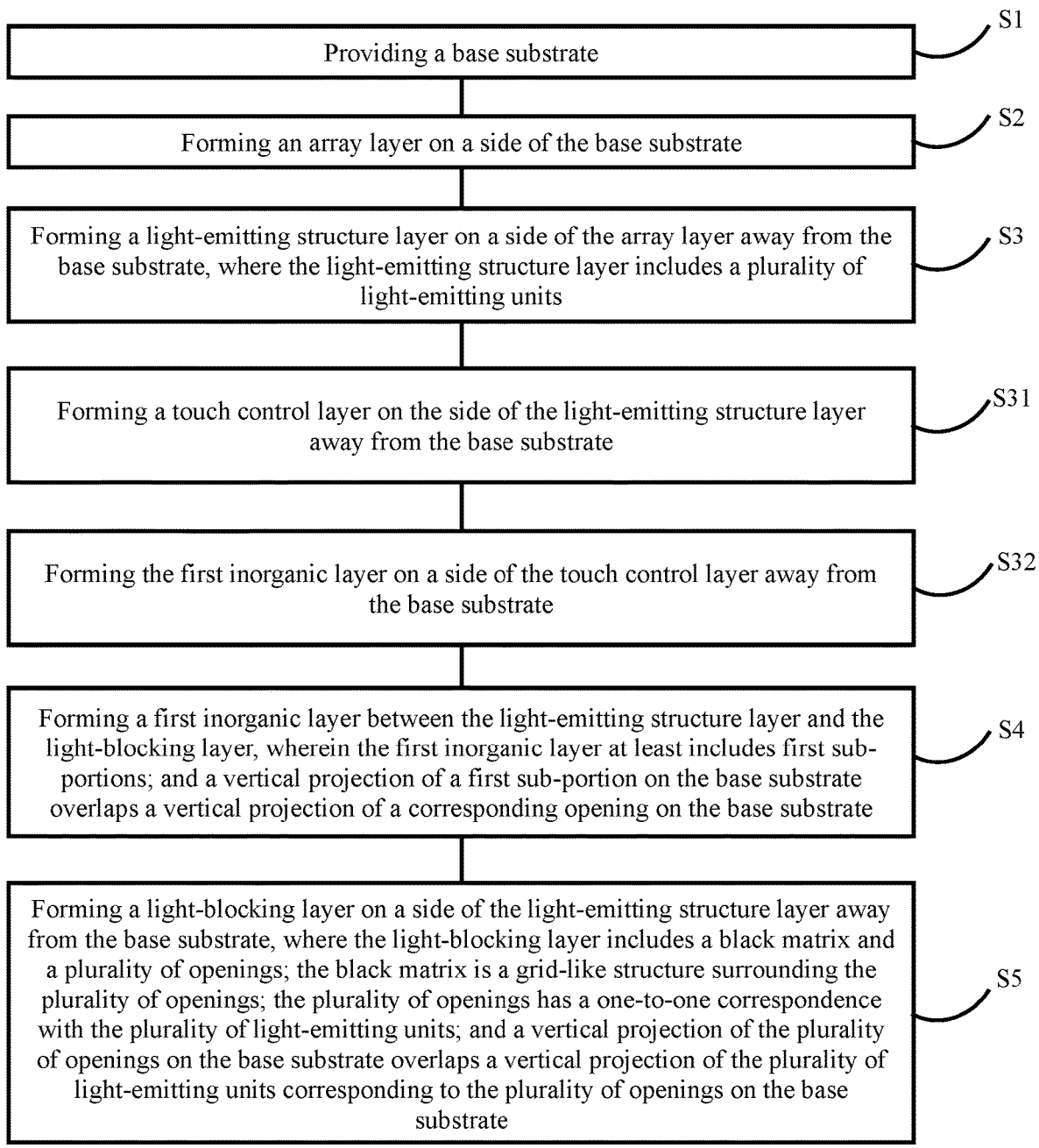
FIG. 4 illustrates another flowchart of a formation method of a display panel according to various embodiments of the present disclosure.
Figure 5:
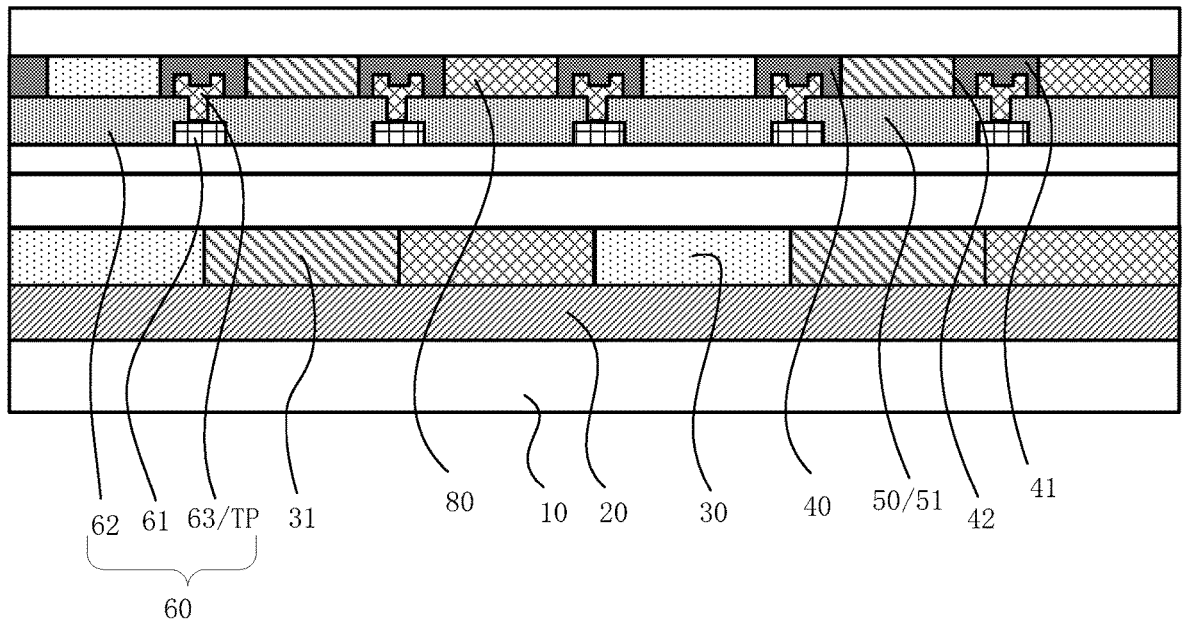
FIG. 5 illustrates a structural schematic of the display panel corresponding to the formation method illustrated in FIG. 4.

FIG. 4 illustrates another flowchart of a formation method of a display panel according to various embodiments of the present disclosure; and FIG. 5 illustrates a structural schematic of the display panel corresponding to the formation method illustrated in FIG. 4. Referring to FIGS. 4-5, the formation method of the display panel provided in one embodiment may include the following.

At S1, the base substrate may be provided.

At S2, the array layer may be formed on the side of the base substrate.

At S3, the light-emitting structure layer may be formed on the side of the array layer away from the base substrate, and the light-emitting structure layer may include the plurality of light-emitting units.

At S4, the first inorganic layer may be formed between the light-emitting structure layer and the light-blocking layer. The first inorganic layer may include at least the first sub-portions; the vertical projection of the first sub-portion on the base substrate may overlap the vertical projection of the opening on the base substrate.

At S5, the light-blocking layer may be formed on the side of the light-emitting structure layer away from the base substrate. The light-blocking layer may include the black matrix and the plurality of openings; the black matrix may be a grid-like structure surrounding the plurality of openings, and the openings may have a one-to-one correspondence with the light-emitting units; and the vertical projection of the opening on the base substrate may overlap the vertical projection of the light-emitting unit corresponding to the opening on the base substrate.

Before forming the first inorganic layer at S4, the method may further include the following.

At S31, a touch control layer may be formed on the side of the light-emitting structure layer away from the base substrate.

At S32, the first inorganic layer may be formed on the side of the touch control layer away from the base substrate.

Referring to FIG. 5, a touch control layer 60 may be formed on the side of the light-emitting structure layer 30 away from the base substrate 10 for realizing the touch function of the display panel. The first inorganic layer 50 may be formed on the side of the touch control layer 60 away from the base substrate 10.

Referring to FIG. 5, optionally, the touch control layer 60 may include the first touch control electrode layer 61, the first passivation layer 62, and the second touch control electrode layer 63 that are sequentially formed on the side of the light-emitting structure layer 30 away from the base substrate 10.

The second touch control electrode layer 63 may include a plurality of touch control lines TP. The vertical projection of the opening 42 on the base substrate 10 may not overlap the vertical projection of the touch control line TP on the base substrate 10. The black matrix 41 may be attached to the touch control line TP.

The first passivation layer 62 may be reused as the first inorganic layer 50.

For example, the touch control layer 60 may include the first touch control electrode layer 61, the first passivation layer 62, and the second touch control electrode layer 63 that are sequentially formed on the side of the light-emitting structure layer 30 away from the base substrate 10. The first passivation layer 62 may cover the first touch control electrode layer 61 and function as an insulation to avoid signal interference between the first touch control electrode layer 61 and the second touch control electrode layer 63. The second touch control electrode layer 63 may include the plurality of touch control lines TP, and the vertical projection of the touch control line TP on the base substrate 10 may be located within the vertical projection of the black matrix 41 on the base substrate 10, which may avoid the visibility problem of the touch control line TP and improve the display effect of the display panel. The first passivation layer 62 may be made of an inorganic material; the first passivation layer 62 may be reused as the first inorganic layer 50; the black matrix 41 may be attached to the touch control line TP; the vertical projection of the opening 42 on the base substrate 10 may not overlap the vertical projection of the touch control line TP on the base substrate 10; and the portion of the black photosensitive resin layer where the opening 42 is subsequently formed may be attached to the first passivation layer 62. The adhesion between the first passivation layer 62 and the black photosensitive resin material may be relatively small, which may effectively avoid the problem that the portion of the black photosensitive resin layer for subsequently forming the opening 42 cannot be completely removed in the subsequent development process, and the black photosensitive resin material portion may partially remain in the opening 42. Therefore, the black photosensitive resin material remaining in the opening 42 may be prevented from affecting the subsequent manufacturing process, and the display quality of the display panel may be effectively improved. The first passivation layer 62 may be reused as the first inorganic layer 50, which may effectively reduce the manufacturing process and production cost.

Figure 6:
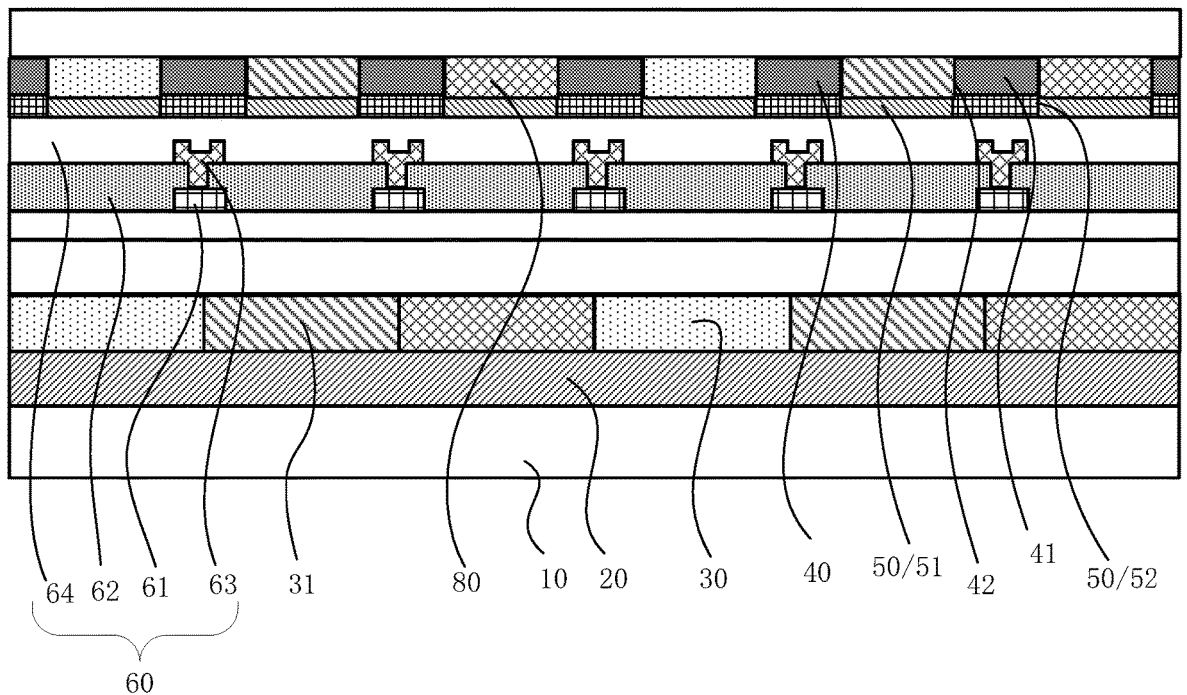
FIG. 6 illustrates another structural schematic of a display panel corresponding to a formation method according to various embodiments of the present disclosure.

FIG. 6 illustrates another structural schematic of a display panel corresponding to a formation method according to various embodiments of the present disclosure. Referring to FIG. 6, optionally, the first inorganic layer 50 may further include the second sub-portions 52, and the vertical projection of the second sub-portion 52 on the base substrate 10 may overlap the vertical projection of the black matrix 41 on the base substrate 10.

For example, the first inorganic layer 50 may include the first sub-portions 51 and the second sub-portions 52; the vertical projection of the first sub-portion 51 on the base substrate 10 may overlap the vertical projection of the opening 42 in the light-blocking layer 40 on the base substrate 10; and the vertical projection of the second sub-portion 52 on the base substrate 10 may overlap the vertical projection of the black matrix 41 in the light-blocking layer 40 on the base substrate 10. That is, the whole first inorganic layer 50 may be formed on the side of the light-emitting structure layer 30 away from the base substrate 10 to improve the flatness, which may be beneficial for subsequently coating the black photosensitive resin layer on the surface of the first inorganic layer 50 away from the base substrate 10 to form the light-blocking layer 40.

It should be noted that, to clearly illustrate the positional relationship between the first sub-portion 51 and the second sub-portion 52 in the first inorganic layer 50 in FIG. 6, the first sub-portion 51 and the second sub-portion 52 may use different filling patterns. In the actual manufacturing process, the first sub-portion 51 and the second sub-portion 52 of the first inorganic layer 50 may be made of a same material in a same process.

Referring to FIG. 6, optionally, the touch control layer 60 may include the first touch control electrode layer 61, the first passivation layer 62, the second touch control electrode layer 63, and a planarization layer 64 that are sequentially formed on the side of the light-emitting structure layer 30 away from the base substrate 10.

The first inorganic layer 50 may be formed on the side of the planarization layer 64 away from the base substrate 10.

For example, the touch control layer 60 may include the first touch control electrode layer 61, the first passivation layer 62, the second touch control electrode layer 63, and the planarization layer that are sequentially formed on the side of the light-emitting structure layer 30 away from the base substrate 10. 64. The first passivation layer 62 may cover the first touch control electrode layer 61 to function as an insulation, thereby avoiding signal interference between the first touch control electrode layer 61 and the second touch control electrode layer 63. The planarization layer 64 may usually be an organic adhesive layer, which may cover the first passivation layer 62 and the second touch control electrode layer 63 to improve the flatness and facilitate subsequent film layer setting. Since the first passivation layer 62 is made of an organic material, its adhesion to the black photosensitive resin for forming the black matrix 41 may be relatively large, which may affect the formation of the opening 42.

The first inorganic layer 50 may be formed on the side of the planarization layer 64 away from the base substrate 10, the black photosensitive resin layer for forming the black matrix 41 may be formed on the surface of the first inorganic layer 50, and the adhesion between the first inorganic layer 50 and the black photosensitive resin material may be relatively small, which may effectively avoid the problem that the portion of the black photosensitive resin layer for subsequently forming the opening 42 cannot be completely removed in the subsequent development process, and the black photosensitive resin material portion may partially remain in the opening 42. Therefore, the black photosensitive resin material remaining in the opening 42 may be prevented from affecting the subsequent manufacturing process, and the display quality of the display panel may be effectively improved.

Figure 7:
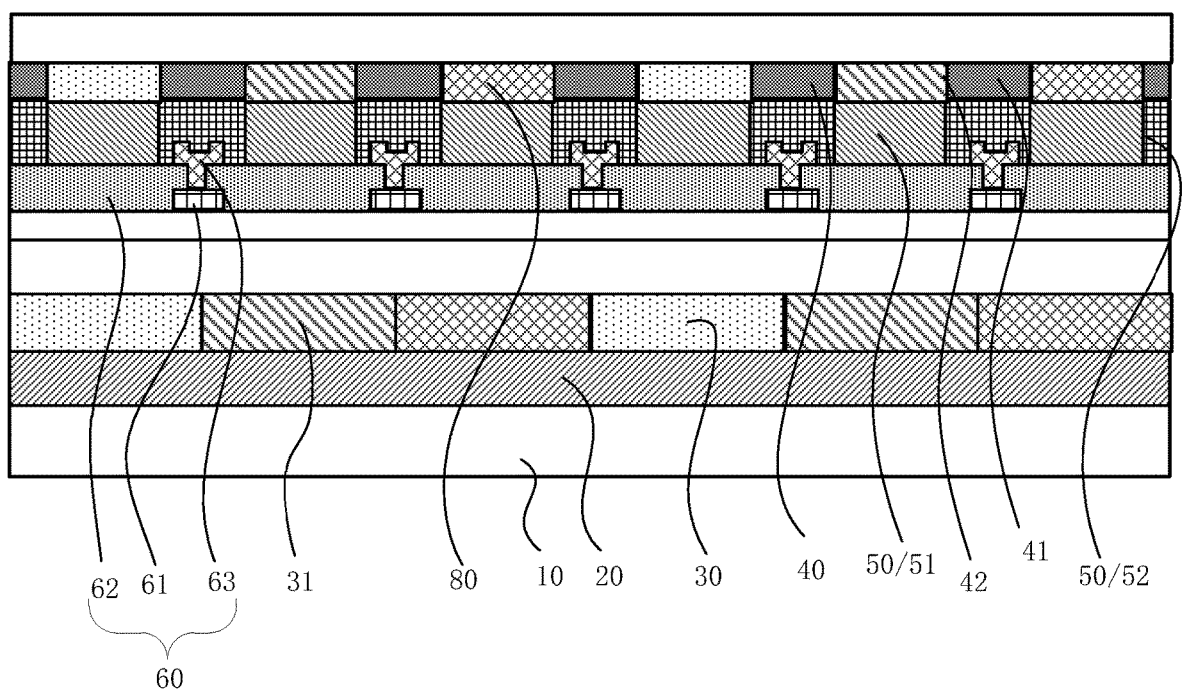
FIG. 7 illustrates another structural schematic of a display panel corresponding to a formation method according to various embodiments of the present disclosure.

Optionally, FIG. 7 illustrates another structural schematic of a display panel corresponding to a formation method according to various embodiments of the present disclosure. The touch control layer 60 may include the first touch control electrode layer 61, the first passivation layer 62, and the second touch control electrode layer 63 that are sequentially formed on the side of the light-emitting structure layer 30 away from the base substrate 10. The first inorganic layer 50 may be formed on the side of the second touch control electrode layer away from the base substrate 10.

Figure 8:
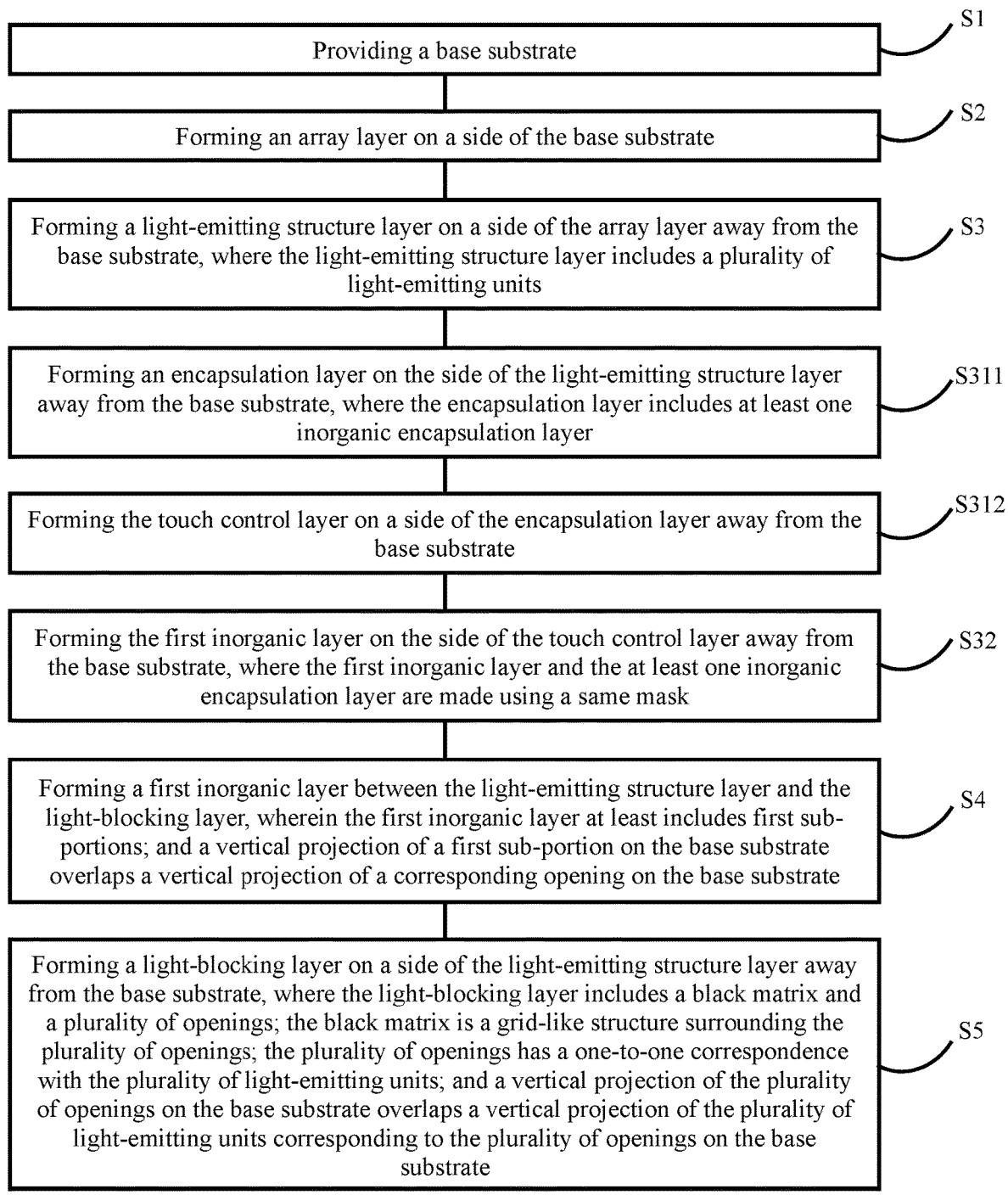
FIG. 8 illustrates another flowchart of a formation method of a display panel according to various embodiments of the present disclosure.
Figure 9:
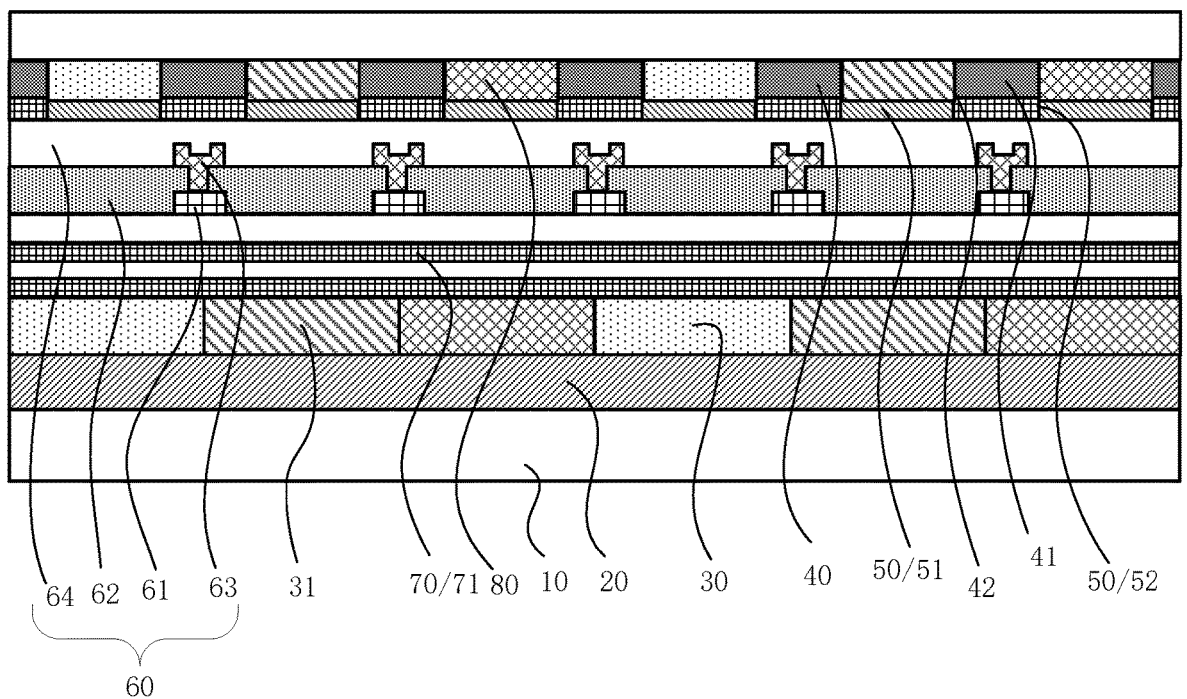
FIG. 9 illustrates a structural schematic of the display panel corresponding to the formation method illustrated in FIG. 8.

Optionally, FIG. 8 illustrates another flowchart of a formation method of a display panel according to various embodiments of the present disclosure; and FIG. 9 illustrates a structural schematic of the display panel corresponding to the formation method illustrated in FIG. 8. Referring to FIGS. 8-9, the formation method of the display panel provided in one embodiment may include the following.

At S1, the base substrate may be provided.

At S2, the array layer may be formed on the side of the base substrate.

At S3, the light-emitting structure layer may be formed on the side of the array layer away from the base substrate, and the light-emitting structure layer may include the plurality of light-emitting units.

At S311, an encapsulation layer may be formed on the side of the light-emitting structure layer away from the base substrate, and the encapsulation layer may include at least one inorganic encapsulation layer.

At S312, a touch control layer may be formed on the side of the encapsulation layer away from the base substrate.

At S32, the first inorganic layer may be formed on the side of the touch control layer away from the base substrate; and the first inorganic layer and the inorganic encapsulation layer may be made using a same mask.

At S4, the first inorganic layer may be formed between the light-emitting structure layer and the light-blocking layer. The first inorganic layer may include at least the first sub-portions; the vertical projection of the first sub-portion on the base substrate may overlap the vertical projection of the opening on the base substrate.

At S5, the light-blocking layer may be formed on the side of the light-emitting structure layer away from the base substrate. The light-blocking layer may include the black matrix and the plurality of openings; the black matrix may be a grid-like structure surrounding the plurality of openings, and the openings may have a one-to-one correspondence with the light-emitting units; and the vertical projection of the opening on the base substrate may overlap the vertical projection of the light-emitting unit corresponding to the opening on the base substrate.

Referring to FIG. 9, the encapsulation layer 70 may be formed on the side of the light-emitting structure layer 30 away from the base substrate 10. The encapsulation layer 70 may protect the light-emitting units 31 in the light-emitting structure layer 30 and the devices in the array layer 20; and prevent external moisture from corroding the light-emitting units 31 in the light-emitting structure layer 30 and the devices in the array layer 20. The encapsulation layer 70 may include at least one inorganic encapsulation layer 71. Exemplarily, the encapsulation layer 70 may be a stacked structure of an inorganic encapsulation layer-an organic encapsulation layer-an inorganic encapsulation layer. The first inorganic layer 50 and the inorganic encapsulation layer 71 may be made using a same mask. That is, the first inorganic layer 50 may be made by the mask used for making the inorganic encapsulation layer 71, without additional masks, which may effectively reduce manufacturing cost.

Figure 10:
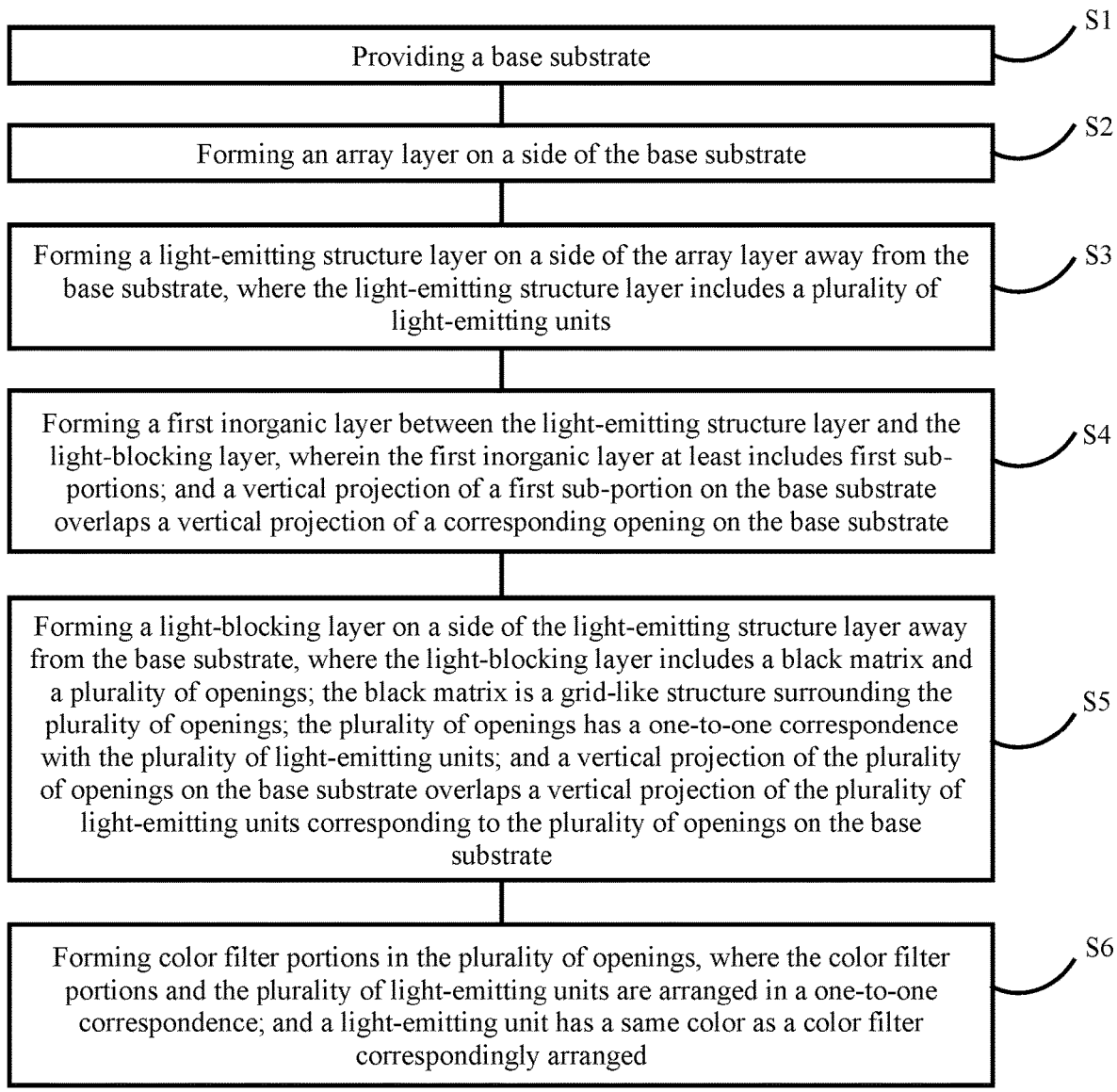
FIG. 10 illustrates another flowchart of a formation method of a display panel according to various embodiments of the present disclosure.
Figure 11:
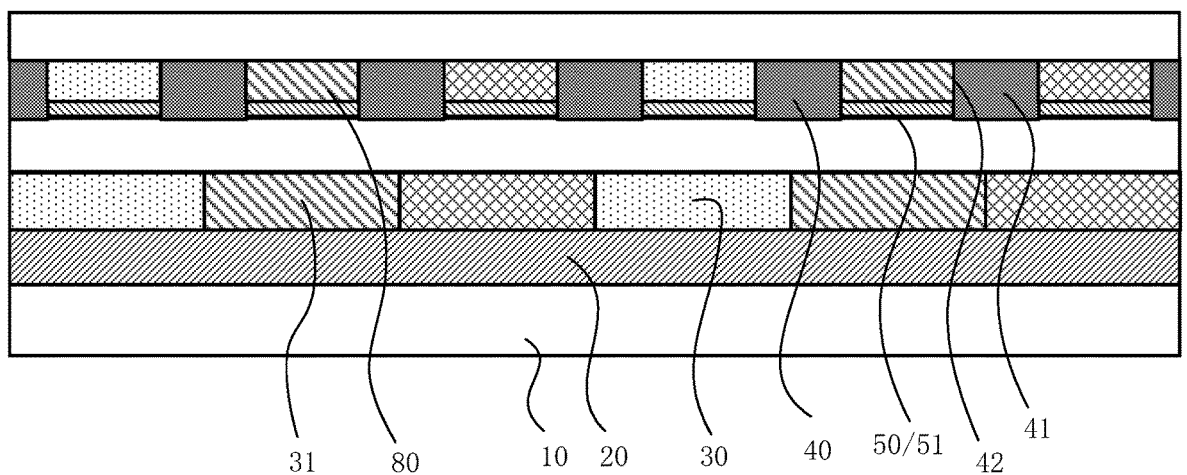
FIG. 11 illustrates a structural schematic of the display panel corresponding to the formation method illustrated in FIG. 10.

Optionally, FIG. 10 illustrates another flowchart of a formation method of a display panel according to various embodiments of the present disclosure; and FIG. 11 illustrates a structural schematic of the display panel corresponding to the formation method illustrated in FIG. 10. Referring to FIGS. 10-11, the formation method of the display panel provided in one embodiment may include the following.

At S1, the base substrate may be provided.

At S2, the array layer may be formed on the side of the base substrate.

At S3, the light-emitting structure layer may be formed on the side of the array layer away from the base substrate, and the light-emitting structure layer may include the plurality of light-emitting units.

At S4, the first inorganic layer may be formed between the light-emitting structure layer and the light-blocking layer. The first inorganic layer may include at least the first sub-portions; the vertical projection of the first sub-portion on the base substrate may overlap the vertical projection of the opening on the base substrate.

At S5, the light-blocking layer may be formed on the side of the light-emitting structure layer away from the base substrate. The light-blocking layer may include the black matrix and the plurality of openings; the black matrix may be a grid-like structure surrounding the plurality of openings; the openings may have a one-to-one correspondence with the light-emitting units; and the vertical projection of the opening on the base substrate may overlap the vertical projection of the light-emitting unit corresponding to the opening on the base substrate.

At S6, color filter parts may be formed in the openings; and the color filter parts and the light-emitting units may be arranged in a one-to-one correspondence. The color filter part may have a same color as the light-emitting unit correspondingly arranged.

For example, color filter parts 80 may be formed in the openings 42; and the color filter parts 80 and the light-emitting units 31 may be arranged in a one-to-one correspondence. The color filter part 80 may have a same color as the light-emitting unit 31 correspondingly arranged, and the light emitted from the light-emitting unit 31 may be emitted to the outside through the color filter part 80. The color filter parts 80 may effectively reduce the effect of external ambient light reflected in the display panel and improve the light-exiting effect of the display panel.

Optionally, the light-emitting units 31 may include red light-emitting units, green light-emitting units, and blue light-emitting units. Correspondingly, the color filter parts 80 may include red color filter parts, green color filter parts, and blue color filter parts. The red color filter parts may be arranged corresponding to the red light-emitting units, the green color filter parts may be arranged correspondingly to the green light-emitting units, and the blue color filter parts may be arranged correspondingly to the blue light-emitting units. It can be understood that the light-emitting units 31 may also include light-emitting units of other colors. Correspondingly, the color filter parts 80 may also include color filter parts of other colors.

Figure 12:
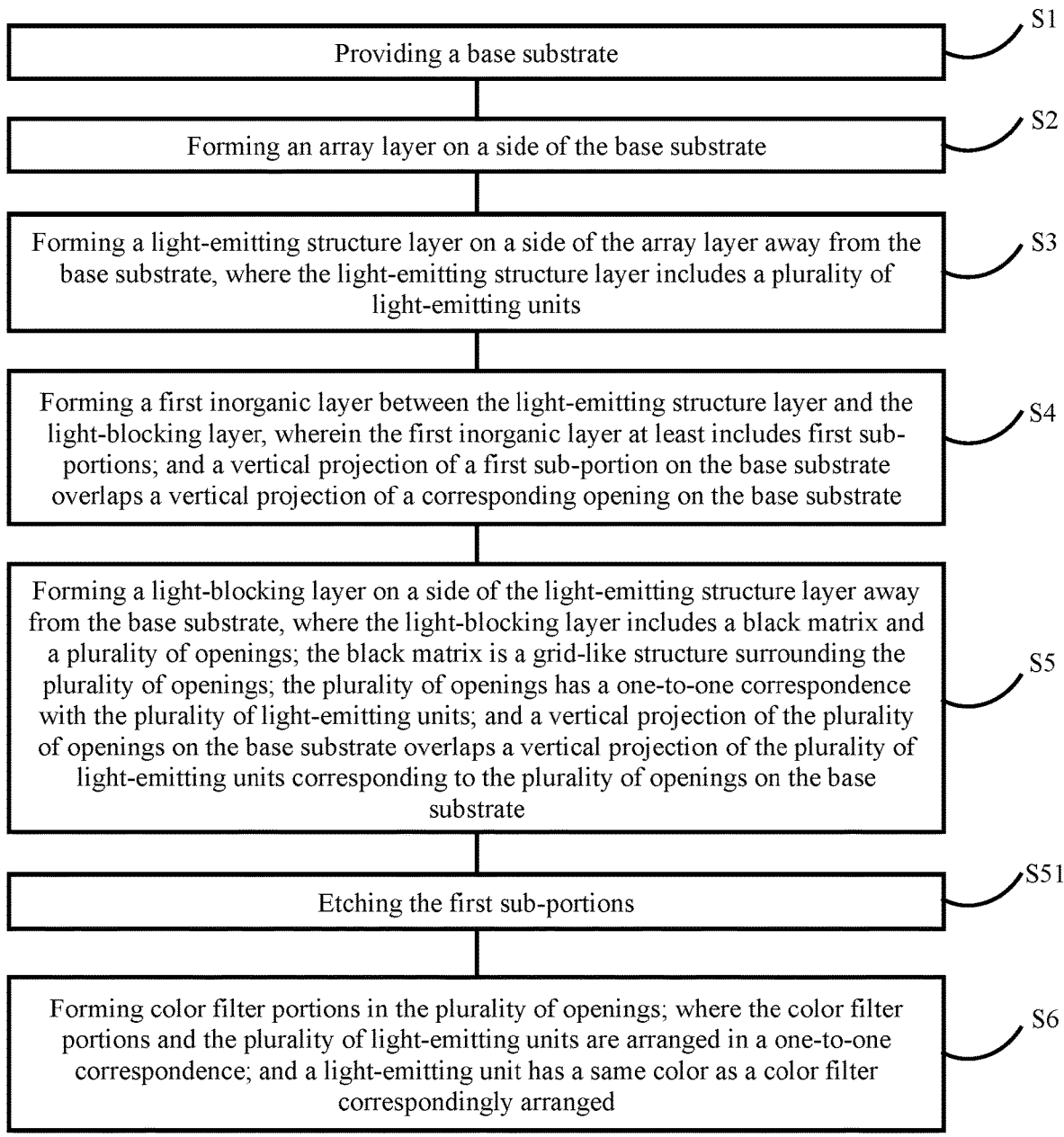
FIG. 12 illustrates another flowchart of a formation method of a display panel according to various embodiments of the present disclosure.
Figure 13:
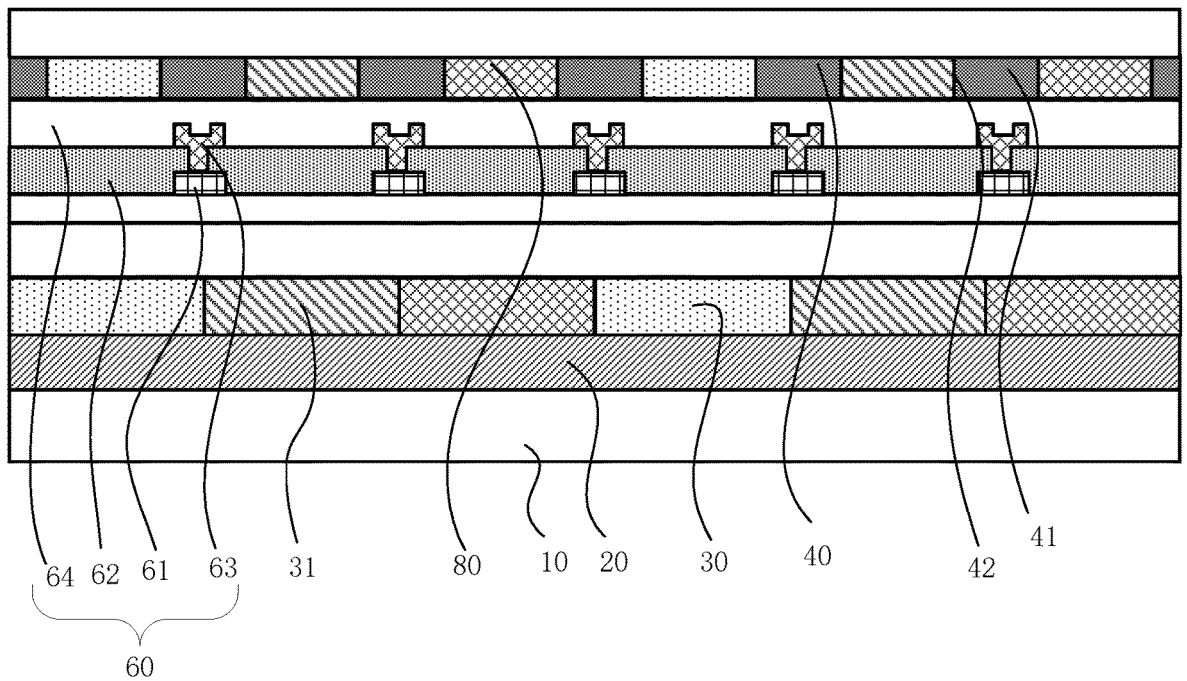
FIG. 13 illustrates a structural schematic of the display panel corresponding to the formation method illustrated in FIG. 12.

FIG. 12 illustrates another flowchart of a formation method of a display panel according to various embodiments of the present disclosure; and FIG. 13 illustrates a structural schematic of the display panel corresponding to the formation method illustrated in FIG. 12. Referring to FIGS. 12-13, the formation method of the display panel provided in one embodiment may include the following.

At S1, the base substrate may be provided.

At S2, the array layer may be formed on the side of the base substrate.

At S3, the light-emitting structure layer may be formed on the side of the array layer away from the base substrate, and the light-emitting structure layer may include the plurality of light-emitting units.

At S4, the first inorganic layer may be formed between the light-emitting structure layer and the light-blocking layer. The first inorganic layer may include at least the first sub-portions; the vertical projection of the first sub-portion on the base substrate may overlap the vertical projection of the opening on the base substrate.

At S5, the light-blocking layer may be formed on the side of the light-emitting structure layer away from the base substrate. The light-blocking layer may include the black matrix and the plurality of openings; the black matrix may be a grid-like structure surrounding the plurality of openings; the openings may have a one-to-one correspondence with the light-emitting units; and the vertical projection of the opening on the base substrate may overlap the vertical projection of the light-emitting unit corresponding to the opening on the base substrate.

At S51, the first sub-portions may be etched.

At S6, the color filter parts may be formed in the openings; and the color filter parts and the light-emitting units may be arranged in a one-to-one correspondence. The color filter part may have a same color as the light-emitting unit correspondingly arranged.

For example, before forming the color filter part 80, the method may further include etching the first sub-portions. Referring to FIG. 13, the first sub-portions may be completely etched away, which may facilitate the configuration of subsequent film layers. In addition, the color filter part 80 may be in direct contact with the organic film layer (for example, the organic adhesive layer of the touch control layer), which may improve the adhesion between the color filter part 80 and the organic film layer and the stability of the display panel.

Figure 14:
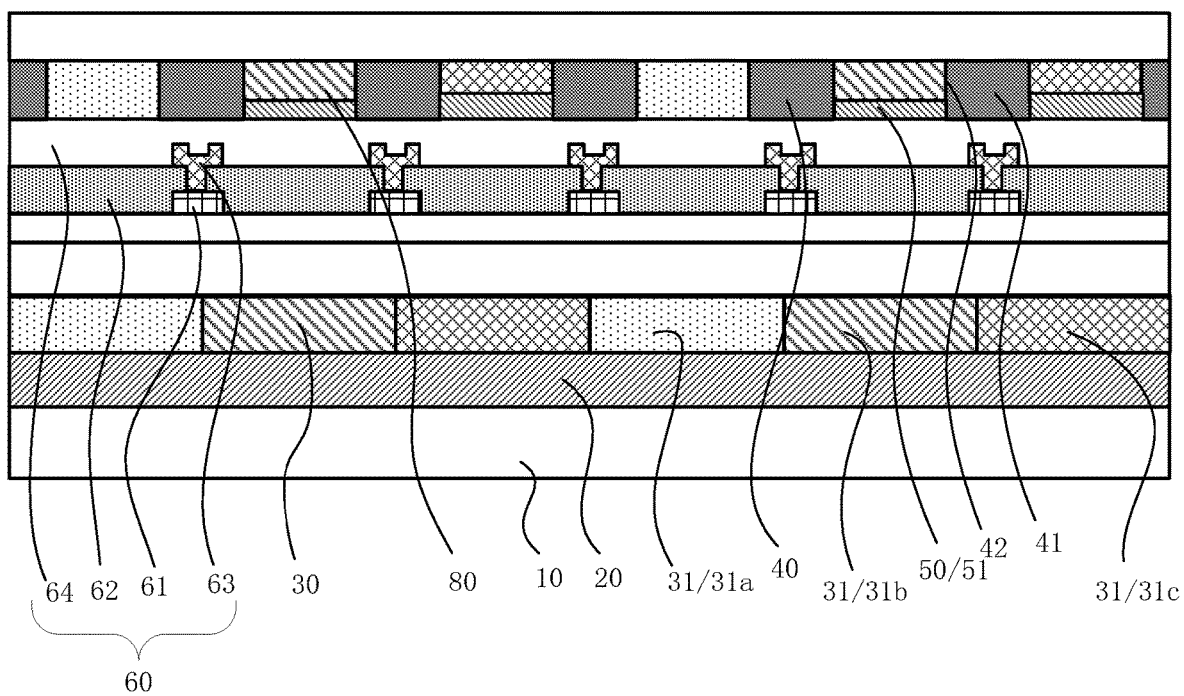
FIG. 14 illustrates another structural schematic of a display panel corresponding to a formation method according to various embodiments of the present disclosure.

FIG. 14 illustrates another structural schematic of a display panel corresponding to a formation method according to various embodiments of the present disclosure. Referring to FIG. 14, optionally, the light-emitting units 31 includes a red light-emitting unit 31a, a green light-emitting unit 31b, and a blue light-emitting unit 31c.

The first sub-portions 51 may be etched, the etching depth of the first sub-portion 51 corresponding to the red light-emitting unit 31a is H1, the etching depth of the first sub-portion 51 corresponding to the green light-emitting unit 31b is H2, and the etching depth of the first sub-portion 51 corresponding to the blue light-emitting unit 31c is H3, where H1>H2>H3.

For example, in the existing technology, for the color filter parts of a same thickness, the light transmittance of the red color filter part, the light transmittance of the green color filter part, and the light transmittance of the blue color filter part may decrease sequentially. Therefore, the image may appear bluish or greenish when the display panel displays an image, resulting in poor display effect of the display panel.

The first sub-portions 51 may be etched, the etching depth of the first sub-portion 51 corresponding to the red light-emitting unit 31a may be greater than the etching depth of the first sub-portion 51 corresponding to the green light-emitting unit 31b, and the etching depth of the first sub-portion 51 corresponding to the green light-emitting unit 31b may be greater than the etching depth of the first sub-portion 51 corresponding to the blue light-emitting unit 31c. That is, the etching depth of the first sub-portion 51 corresponding to the red light-emitting unit 31a is the largest, the etching depth of the first sub-portion 51 corresponding to the green light-emitting unit 31b is the second largest, and the etching depth of the first sub-portion 51 corresponding to the blue light-emitting unit 31c is the smallest. Therefore, while ensuring the flatness of the display panel, along the direction perpendicular to the base substrate 10, the thickness of the red color filter part 81 is the largest, the thickness of the green color filter part 82 is the second largest, and the thickness of the blue color filter part 83 is the smallest. As a result, the filter rates of the red color filter part 81, the green color filter part 82, and the blue color filter part 83 may tend to be consistent, and the display effect of the display panel may be improved.

It should be noted that FIG. 14 exemplarily shows that all of the first sub-portions corresponding to the red light-emitting units 31a are etched away. In other embodiments of the present disclosure, the first sub-portions corresponding to the red light-emitting units 31a may not be completely etched; or on the basis that all of the first sub-portions corresponding to the red light-emitting units 31a are etched away, other film layers (exemplarily, the organic adhesive layer in the touch control layer) opposite to the red light-emitting units 31a may be further etched, thereby increasing the thickness of the red color filters 81.

Optionally, the formation method of the display panel provided by the present disclosure may further include that a roughening process may be performed on the side of the second sub-portion away from the base substrate.

Figure 15:
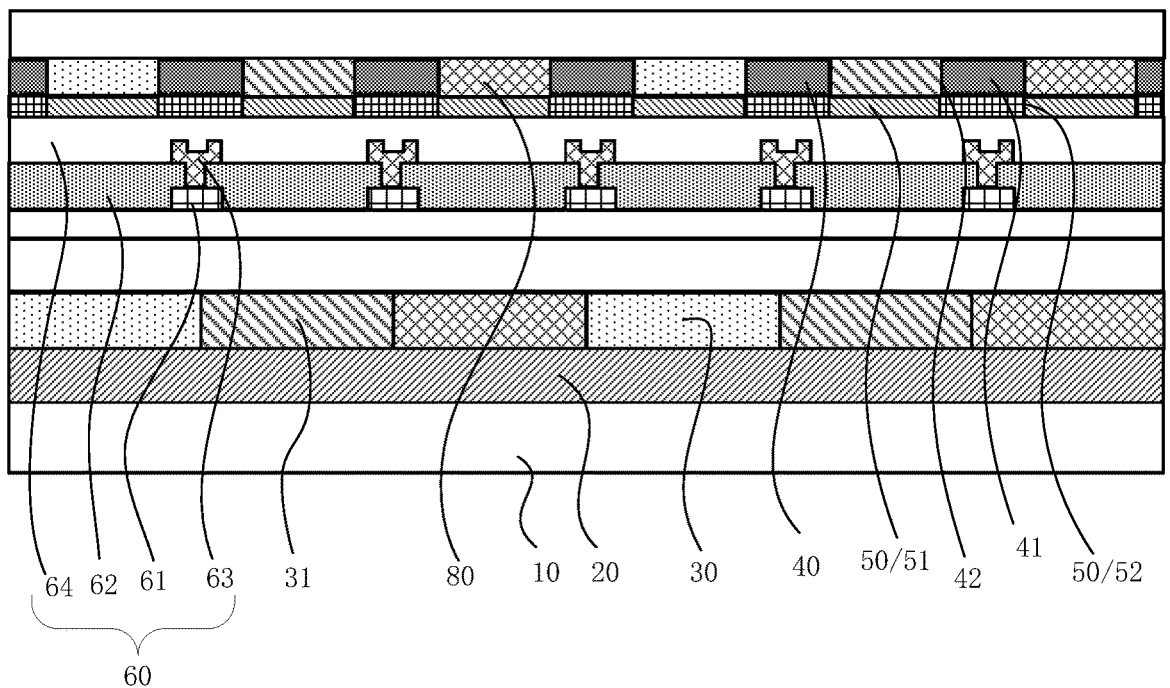
FIG. 15 illustrates another structural schematic of a display panel corresponding to a formation method according to various embodiments of the present disclosure.
Figure 16:
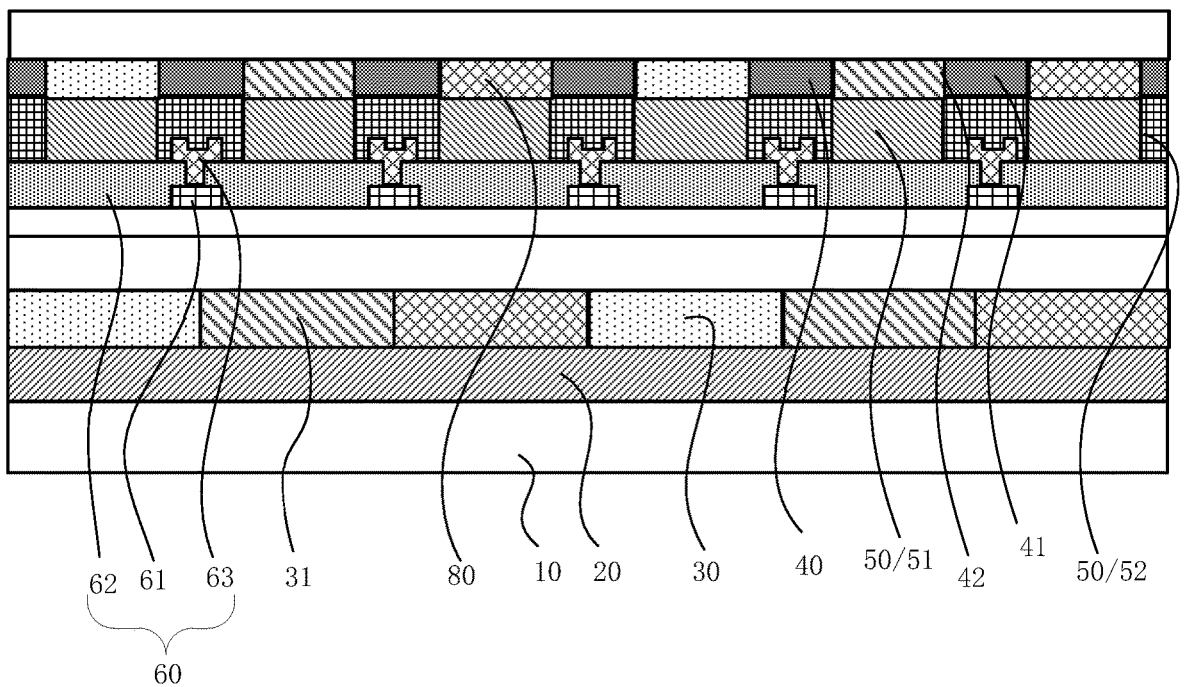
FIG. 16 illustrates another structural schematic of a display panel corresponding to a formation method according to various embodiments of the present disclosure.

FIGS. 15-16 illustrate structural schematics of a display panel corresponding to a formation method according to various embodiments of the present disclosure. The black photosensitive resin layer may be coated on the surface of the second sub-portion 52 away from the base substrate 10 to form the black matrix 41, and the vertical projection of the black matrix 41 on the base substrate 10 may overlap the vertical projection of the second sub-portion 52 on the base substrate 10. By performing the roughening process on the surface of the second sub-portion 52 away from the base substrate 10, when the black photosensitive resin layer is subsequently applied to the surface of the second sub-portion 52 away from the base substrate 10, it is beneficial to coat the black photosensitive resin material with a certain fluidity on the side of the second sub-portion 52 away from the base substrate 10.

Figure 17:
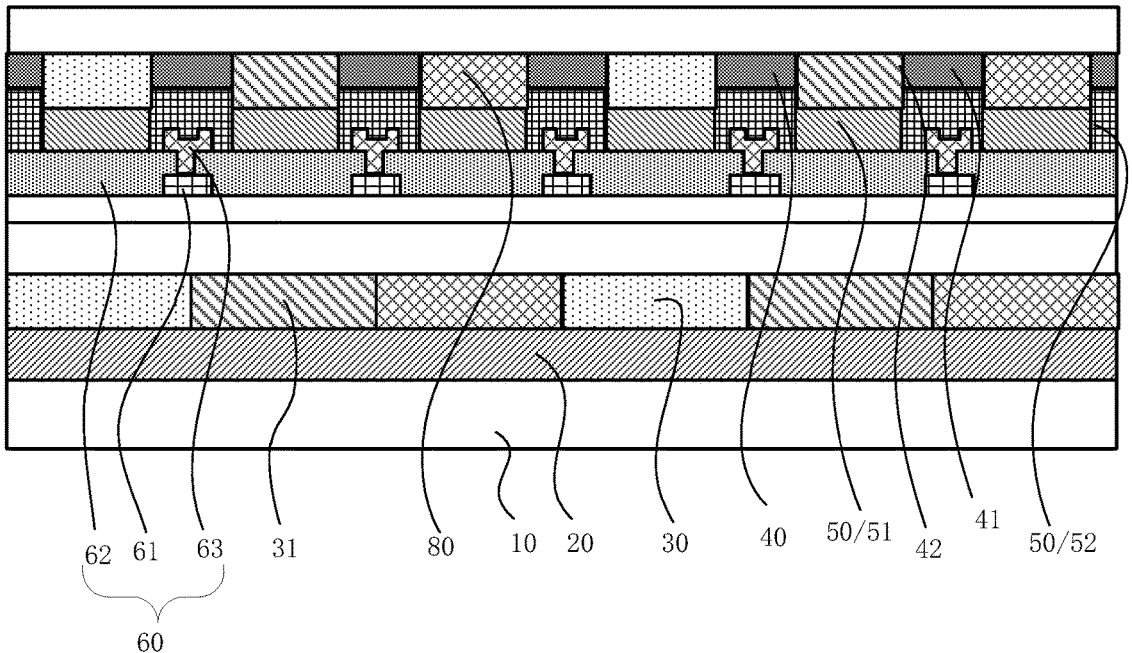
FIG. 17 illustrates another structural schematic of a display panel corresponding to a formation method according to various embodiments of the present disclosure.

FIG. 17 illustrates another structural schematic of a display panel corresponding to a formation method according to various embodiments of the present disclosure. As shown in FIG. 17, the thickness of the second sub-portion 52 may be greater than the thickness of the first sub-portion 51.

Figure 18:
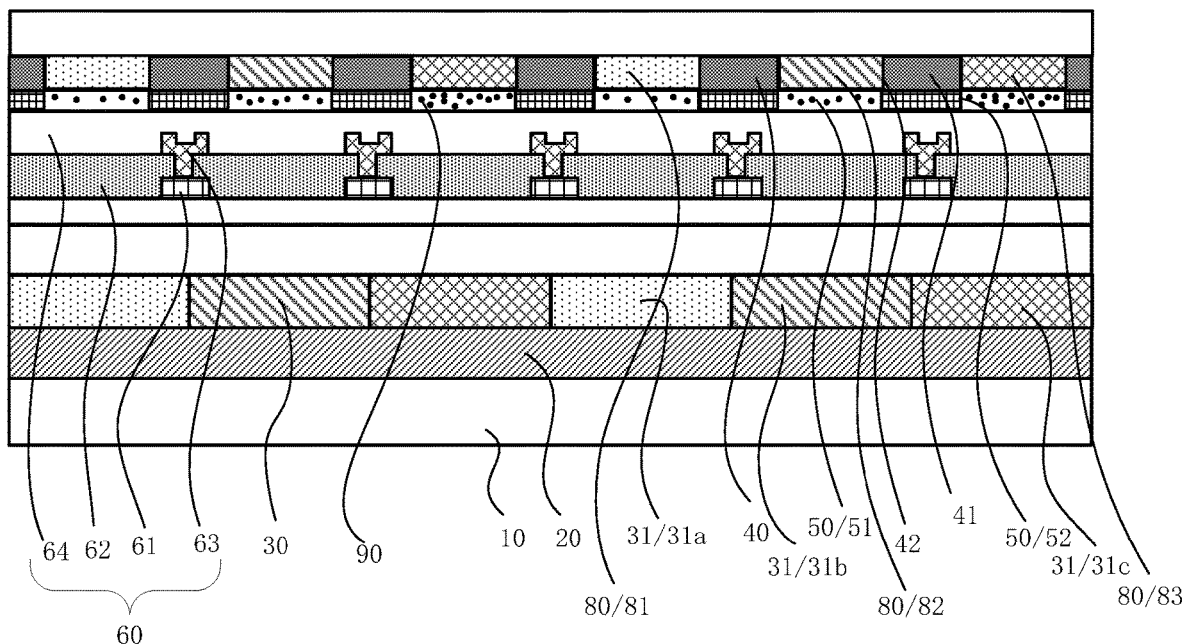
FIG. 18 illustrates another structural schematic of a display panel corresponding to a formation method according to various embodiments of the present disclosure.

FIG. 18 illustrates another structural schematic of a display panel corresponding to a formation method according to various embodiments of the present disclosure. Referring to FIG. 18, optionally, the light-emitting units 31 may include red light-emitting units 31a, green light-emitting units 31b, and blue light-emitting units 31c.

At least the first sub-portions 51 corresponding to the blue light-emitting units 31c may be filled with scattering particles 90.

For example, the light-emitting units 31 may include the red light-emitting units 31a, the green light-emitting units 31b, and the blue light-emitting units 31c. Correspondingly, the color filter parts 80 may include red color filter parts 81, green color filter parts 82, and blue color filter parts 83. In addition, the red color filters 81 may be arranged corresponding to the red light-emitting units 31a, the green color filters 82 may be arranged corresponding to the green light-emitting units 31b, and the blue color filters 83 may be arranged corresponding to the blue light-emitting units 31c.

In the existing technology, for the color filter parts of a same thickness, the light transmittance of the red color filter part, the light transmittance of the green color filter part, and the light transmittance of the blue color filter part may decrease sequentially. Therefore, the image may appear bluish or greenish when the display panel displays an image, resulting in poor display effect of the display panel.

The first sub-portions 51 corresponding to the blue light-emitting units 31c may be filled with scattering particles 90. The scattering particles 90 may cause the blue light emitted from the blue light-emitting units 31c to be scattered and reflected multiple times when entering the first sub-portions 51 corresponding to the blue light-emitting units 31c. Therefore, the number of blue light rays emitted from the first sub-portions 51 corresponding to the blue light-emitting units 31c may be improved; and the differences between the number of light rays emitted from the blue color filters 83 and each of the number of light rays emitted from the red light-emitting units 31a and the number of light rays emitted from the green light-emitting units 31b may be reduced, thereby improving the display effect of the display panel.

Referring to FIG. 18, optionally, the first sub-portions 51 may all be filled with scattering particles 90. The density of the scattering particles 90 in the first sub-portion 51 corresponding to the blue light-emitting unit 31c may be greater than the density of the scattering particles 90 in the first sub-portion 51 corresponding to the green light-emitting unit 31b and greater than the density of the scattering particles 90 in the first sub-portion 51 corresponding to the red light-emitting unit 31c.

For example, the first sub-portions 51 may all be filled with scattering particles 90. The density of the scattering particles 90 in the first sub-portion 51 corresponding to the blue light-emitting unit 31c, the density of the scattering particles 90 in the first sub-portion 51 corresponding to the green light-emitting unit 31b, and the density of the scattering particles 90 in the first sub-portion 51 corresponding to the red light-emitting unit 31c may decrease sequentially. Therefore, the light extraction rate of blue light rays emitted from the first sub-portion 51 corresponding to the blue light-emitting unit 31c, the light extraction rate of green light rays emitted from the first sub-portion 51 corresponding to the green light-emitting unit 31b, and the light extraction rate of red light rays emitted from the first sub-portion 51 corresponding to the red light-emitting unit 31a may decrease sequentially. In such way, the luminous efficiency of blue light, the luminous efficiency of green light and the luminous efficiency red light may tend to be consistent, thereby further improving the display effect of the display panel.

Figure 19:
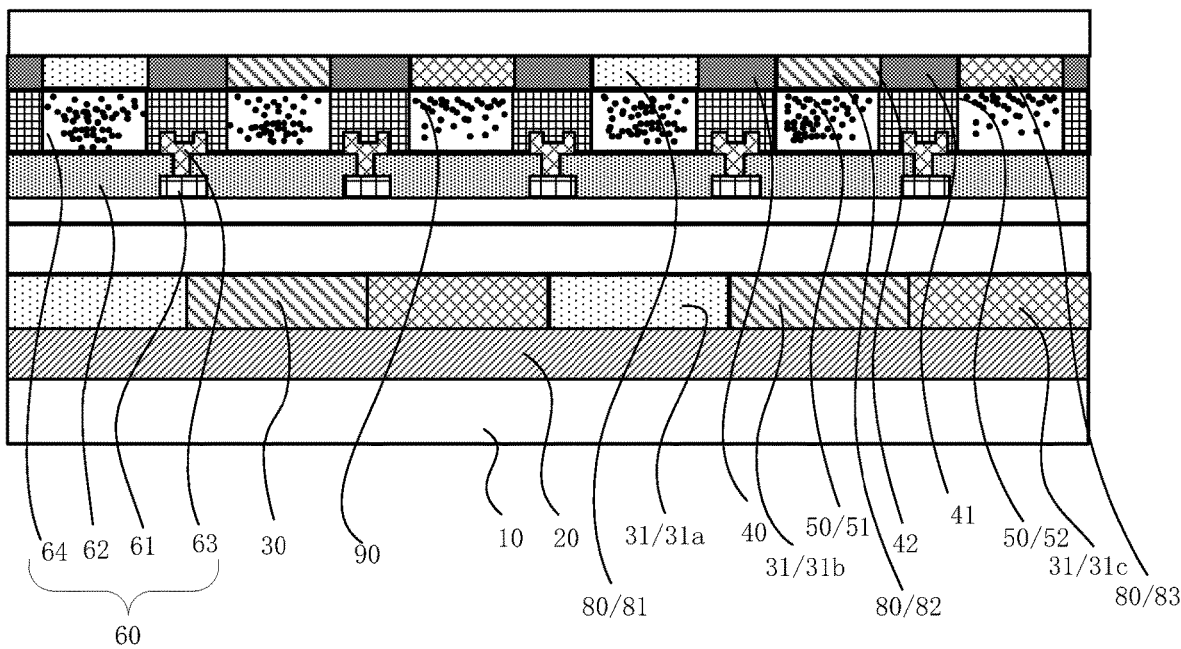
FIG. 19 illustrates another structural schematic of a display panel corresponding to a formation method according to various embodiments of the present disclosure.

FIG. 19 illustrates another structural schematic of a display panel corresponding to a formation method according to various embodiments of the present disclosure. Optionally, along the direction from the base substrate 10 to the light-exiting surface of the display panel, the density of the scattering particles 90 in the first sub-portion 51 corresponding to the blue light-emitting unit 31c may gradually increase.

For example, along the direction from the base substrate 10 to the light-emitting surface of the display panel, the closer the light-emitting surface of the display panel is, the greater the density of the scattering particles 90 in the first sub-portions 51 corresponding to the blue light-emitting units 31c is, and the more the scattered and reflected rays of the blue light in the first sub-portions 51 corresponding to the blue light-emitting units 31c are. The number of blue light rays emitted from the first sub-portions 51 corresponding to the blue light-emitting units 31c may be further increased.

Referring to FIG. 3, various embodiments of the present disclosure provide a display panel.

The display panel may include the base substrate 10; the array layer 20 on the side of the base substrate 10; the light-emitting structure layer 30 on the side of the array layer 20 away from the base substrate 10, where the light-emitting structure layer 30 includes the plurality of light-emitting units 31; the first inorganic layer 50 on the side of the light-emitting structure layer 30 away from the base substrate 10; and the light-blocking layer 40 on the side of the first inorganic layer 50 away from the base substrate 10, where the light-blocking layer 40 includes the black matrix 41 and the plurality of openings 42; the black matrix 41 is a grid-like structure surrounding the plurality of openings 42; the openings 42 have a one-to-one correspondence with the light-emitting units 31; and the vertical projection of the opening 42 on the base substrate 10 overlaps the vertical projection of its corresponding light-emitting unit 31 on the base substrate 10.

The first inorganic layer 50 may at least include the first sub-portions 51; and the vertical projection of the first sub-portion 51 on the base substrate 10 may overlap the vertical projection of the opening 42 on the base substrate 10.

For example, the display panel provided in one embodiment may include the base substrate 10. The base substrate 10 may be a rigid substrate, for example, a glass substrate. The base substrate 10 may also be a flexible substrate, for example, a polyimide substrate. The display panel may further include the array layer 20 and the light-emitting structure layer 30 which are sequentially formed on the side of the base substrate 10; and the light-emitting structure layer 30 may include the plurality of light-emitting units 31. The array layer 20 may include various functional film layers related to pixel drive circuits for driving the light-emitting units 31 to emit light. The pixel drive circuits may include thin film transistors, storage capacitors, and other circuit elements known to those skilled in the art. Exemplarily, taking the thin film transistor as an example, the array layer may include an active layer, a gate electrode insulating layer, a gate electrode layer, an interlayer insulating layer, a source/drain electrode layer, and other layers known to those skilled in the art. The plurality of light-emitting units 31 may be formed in the light-emitting structure layer 30; and the light-emitting units 31 may be used for emitting light to display a picture to be displayed. Exemplarily, the light-emitting unit 31 may be an organic light-emitting unit, a liquid crystal display light-emitting unit, a Mini-LED, a Micro-LED, or other types of light-emitting units known to those skilled in the art.

The display panel may further include the light-blocking layer 40 formed on the side of the light-emitting structure layer 30 away from the base substrate 10; the light-blocking layer 40 may include the black matrix 41 and the plurality of openings 42; the black matrix 41 may be a grid-like structure surrounding the plurality of openings 42; the openings 42 may have a one-to-one correspondence with the light-emitting units 31; the vertical projection of the opening 42 on the base substrate 10 may overlap the vertical projection of the corresponding light-emitting unit 31 on the base substrate 10; and the light emitted from the light-emitting unit 31 may be emitted through the opening 42.

The display panel may further include the first inorganic layer 50 formed on the side of the light-emitting structure layer 30 away from the base substrate 10. The first inorganic layer 50 may include the first sub-portions 51. The vertical projection of the first sub-portion 51 on the base substrate 10 may overlap the vertical projection of the opening 42 in the light-blocking layer 40 on the base substrate 10. The black matrix 41 in the light-blocking layer 40 may be a grid structure surrounding the plurality of openings 42. The fabrication of the black matrix 41 may be that the black photosensitive resin layer may be coated on the surface of the first inorganic layer 50 on the side away from the base substrate 10, and the black matrix 41 with a grid structure surrounding a plurality of openings 42 may be formed by exposure and development. The vertical projection of the first sub-portion 51 on the base substrate 10 overlaps the vertical projection of the opening 42 formed in the light-blocking layer 40 on the base substrate 10, that is, the portion of the black photosensitive resin layer where the opening 42 is subsequently formed may be attached to the first sub-portion 51. Therefore, the first sub-portion 51, made of inorganic material, may have a relatively small adhesion with the black photosensitive resin material, which may effectively avoid the problem that the portion of the black photosensitive resin layer for subsequently forming the opening 42 cannot be completely removed in the subsequent development process, and the black photosensitive resin material portion may partially remain in the opening 42. Therefore, the black photosensitive resin material remaining in the opening 42 may be prevented from affecting the subsequent manufacturing process, and the display quality of the display panel may be effectively improved.

It should be noted that the display panel in one embodiment may also include a color filter part in the opening, a cover plate, an optical adhesive, a thin film encapsulation layer, and other film layers known to those skilled in the art. In order to clearly illustrate the technical points of the present disclosure, the above-mentioned film layers may not be shown in FIG. 3.

Referring to FIG. 5, optionally, the display panel may further include the touch control layer 60. The touch control layer 60 may be on the side of the light-emitting structure layer 30 away from the base substrate 10, and the first inorganic layer 50 may be on the side of the touch control layer 60 away from the base substrate 10.

For example, the display panel may further include the touch control layer 60 formed on the side of the light-emitting structure layer 30 away from the base substrate 10 to realize the touch control function of the display panel. The first inorganic layer 50 may be formed on the side of the touch control layer 60 away from the base substrate 10.

Referring to FIG. 5, optionally, the touch control layer 60 may include the first touch control electrode layer 61, the first passivation layer 62, and the second touch control electrode layer 63 that are sequentially formed on the side of the light-emitting structure layer 30 away from the base substrate 10.

The second touch control electrode layer 63 may include the plurality of touch control lines TP. The vertical projection of the opening 42 on the base substrate 10 may not overlap the vertical projection of the touch control line TP on the base substrate 10. The black matrix 41 may be attached to the touch control line TP.

The first passivation layer 62 may be reused as the first inorganic layer 50.

For example, the touch control layer 60 may include the first touch control electrode layer 61, the first passivation layer 62, and the second touch control electrode layer 63 that are sequentially formed on the side of the light-emitting structure layer 30 away from the base substrate 10. The first passivation layer 62 may cover the first touch control electrode layer 61 and function as an insulation to avoid signal interference between the first touch control electrode layer 61 and the second touch control electrode layer 63. The second touch control electrode layer 63 may include the plurality of touch control lines TP, and the vertical projection of the touch control line TP on the base substrate 10 may be within the vertical projection of the black matrix 41 on the base substrate 10, which may avoid the visibility problem of the touch control line TP and improve the display effect of the display panel. The first passivation layer 62 may be made of an inorganic material; the first passivation layer 62 may be reused as the first inorganic layer 50; the black matrix 41 may be attached to the touch control line TP; the vertical projection of the opening 42 on the base substrate 10 may not overlap the vertical projection of the touch control line TP on the base substrate 10; and the portion of the black photosensitive resin layer where the opening 42 is subsequently formed may be attached to the first passivation layer 62. The adhesion between the first passivation layer 62 and the black photosensitive resin material may be relatively small, which may effectively avoid the problem that the portion of the black photosensitive resin layer for subsequently forming the opening 42 cannot be completely removed in the subsequent development process, and the black photosensitive resin material portion may partially remain in the opening 42. Therefore, the black photosensitive resin material remaining in the opening 42 may be prevented from affecting the subsequent manufacturing process, and the display quality of the display panel may be effectively improved. The first passivation layer 62 may be reused as the first inorganic layer 50, which may effectively reduce the manufacturing process and production cost.

Referring to FIG. 6, optionally, the first inorganic layer 50 may further include the second sub-portions 52, and the vertical projection of the second sub-portion 52 on the base substrate 10 may overlap the vertical projection of the black matrix 41 on the base substrate 10.

For example, the first inorganic layer 50 may include the first sub-portion 51 and the second sub-portion 52; the vertical projection of the first sub-portion 51 on the base substrate 10 may overlap the vertical projection of the opening 42 in the light-blocking layer 40 on the base substrate 10; and the vertical projection of the second sub-portion 52 on the base substrate 10 may overlap the vertical projection of the black matrix 41 in the light-blocking layer 40 on the base substrate 10. That is, the whole first inorganic layer 50 may be formed on the side of the light-emitting structure layer 30 away from the base substrate 10 to improve the flatness, which may be beneficial for subsequently coating the black photosensitive resin layer on the surface of the first inorganic layer 50 away from the base substrate 10 to form the light-blocking layer 40.

Referring to FIG. 6, optionally, the touch control layer 60 may include the first touch control electrode layer 61, the first passivation layer 62, the second touch control electrode layer 63, and the planarization layer 64 that are sequentially formed on the side of the light-emitting structure layer 30 away from the base substrate 10.

The first inorganic layer 50 may be formed on the side of the planarization layer 64 away from the base substrate 10.

For example, the touch control layer 60 may include the first touch control electrode layer 61, the first passivation layer 62, the second touch control electrode layer 63, and the planarization layer that are sequentially formed on the side of the light-emitting structure layer 30 away from the base substrate 10. 64. The first passivation layer 62 may cover the first touch control electrode layer 61 to function as an insulation, thereby avoiding signal interference between the first touch control electrode layer 61 and the second touch control electrode layer 63. The planarization layer 64 may usually be an organic adhesive layer, which may cover the first passivation layer 62 and the second touch control electrode layer 63 to improve the flatness and facilitate subsequent film layer setting. Since the first passivation layer 62 is made of an organic material, its adhesion to the black photosensitive resin for forming the black matrix 41 may be relatively large, which may affect the formation of the opening 42.

The first inorganic layer 50 may be formed on the side of the planarization layer 64 away from the base substrate 10, the black photosensitive resin layer for forming the black matrix 41 may be formed on the surface of the first inorganic layer 50, the adhesion between the first inorganic layer 50 and the black photosensitive resin material may be relatively small, which may effectively avoid the problem that the portion of the black photosensitive resin layer for subsequently forming the opening 42 cannot be completely removed in the subsequent development process, and the black photosensitive resin material portion may partially remain in the opening 42. Therefore, the black photosensitive resin material remaining in the opening 42 may be prevented from affecting the subsequent manufacturing process, and the display quality of the display panel may be effectively improved.

Referring to FIG. 15, optionally, the roughening process may be performed on the side of the second sub-portion away from the base substrate.

For example, the black photosensitive resin layer may be coated on the surface of the second sub-portion 52 away from the base substrate 10 to form the black matrix 41, and the vertical projection of the black matrix 41 on the base substrate 10 may overlap the vertical projection of the second sub-portion 52 on the base substrate 10. By performing the roughening process on the surface of the second sub-portion 52 away from the base substrate 10, when the black photosensitive resin layer is subsequently applied to the surface of the second sub-portion 52 away from the base substrate 10, it is beneficial to coat the black photosensitive resin material with a certain fluidity on the side of the second sub-portion 52 away from the base substrate 10.

Referring to FIG. 18, optionally, the light-emitting units 31 may include red light-emitting units 31a, green light-emitting units 31b, and blue light-emitting units 31c.

At least the first sub-portions 51 corresponding to the blue light-emitting units 31c may be filled with scattering particles 90.

For example, the light-emitting units 31 may include red light-emitting units 31a, green light-emitting units 31b, and blue light-emitting units 31c. Correspondingly, the color filter parts 80 may include red color filter parts 81, green color filter parts 82, and blue color filter parts 83. In addition, the red color filters 81 may be arranged corresponding to the red light-emitting units 31a, the green color filters 82 may be arranged corresponding to the green light-emitting units 31b, and the blue color filters 83 may be arranged corresponding to the blue light-emitting units 31c.

In the existing technology, for the color filter parts of a same thickness, the light transmittance of the red color filter part, the light transmittance of the green color filter part, and the light transmittance of the blue color filter part may decrease sequentially. Therefore, the image may appear bluish or greenish when the display panel displays an image, resulting in poor display effect of the display panel.

The first sub-portions 51 corresponding to the blue light-emitting units 31c may be filled with scattering particles 90. The scattering particles 90 may cause the blue light emitted from the blue light-emitting units 31c to be scattered and reflected multiple times when entering the first sub-portions 51 corresponding to the blue light-emitting units 31c. Therefore, the number of blue light rays emitted from the first sub-portions 51 corresponding to the blue light-emitting units 31c may be increased; and the differences between the number of light rays emitted from the blue color filters 83 and each of the number of light rays emitted from the red light-emitting units 31a and the number of light rays emitted from the green light-emitting units 31b may be reduced, thereby improving the display effect of the display panel.

Referring to FIG. 18, optionally, the first sub-portions 51 may all be filled with scattering particles 90.

The density of the scattering particles 90 in the first sub-portion 51 corresponding to the blue light-emitting unit 31c may be greater than the density of the scattering particles 90 in the first sub-portion 51 corresponding to the green light-emitting unit 31b and greater than the density of the scattering particles 90 in the first sub-portion 51 corresponding to the red light-emitting unit 31c.

For example, the first sub-portions 51 may be filled with scattering particles 90. The density of the scattering particles 90 in the first sub-portion 51 corresponding to the blue light-emitting unit 31c, the density of the scattering particles 90 in the first sub-portion 51 corresponding to the green light-emitting unit 31b, and the density of the scattering particles 90 in the first sub-portion 51 corresponding to the red light-emitting unit 31c may decrease sequentially. Therefore, the number of blue light rays emitted from the first sub-portion 51 corresponding to the blue light-emitting unit 31c, the number of green light rays emitted from the first sub-portion 51 corresponding to the green light-emitting unit 31b, and the number of red light rays emitted from the first sub-portion 51 corresponding to the red light-emitting unit 31a may decrease sequentially. In such way, the number of light rays emitted from the blue color filter part 83, the number of light rays emitted from the red light-emitting unit 31a, and the number of light rays emitted from the green light-emitting unit 31b may tend to be consistent, thereby further improving the display effect of the display panel.

Referring to FIG. 18, optionally, along the direction from the base substrate 10 to the light-emitting surface of the display panel, the density of the scattering particle 90 in the first sub-portion 51 corresponding to the blue light-emitting unit 31c may gradually increase.

For example, along the direction from the base substrate 10 to the light-emitting surface of the display panel, the closer the light-emitting surface of the display panel is, the greater the density of the scattering particles 90 in the first sub-portions 51 corresponding to the blue light-emitting units 31c is, and the more the scattered and reflected rays of the blue light in the first sub-portions 51 corresponding to the blue light-emitting units 31c are. The number of blue light rays emitted from the first sub-portions 51 corresponding to the blue light-emitting units 31c may be further increased.

Figure 20:
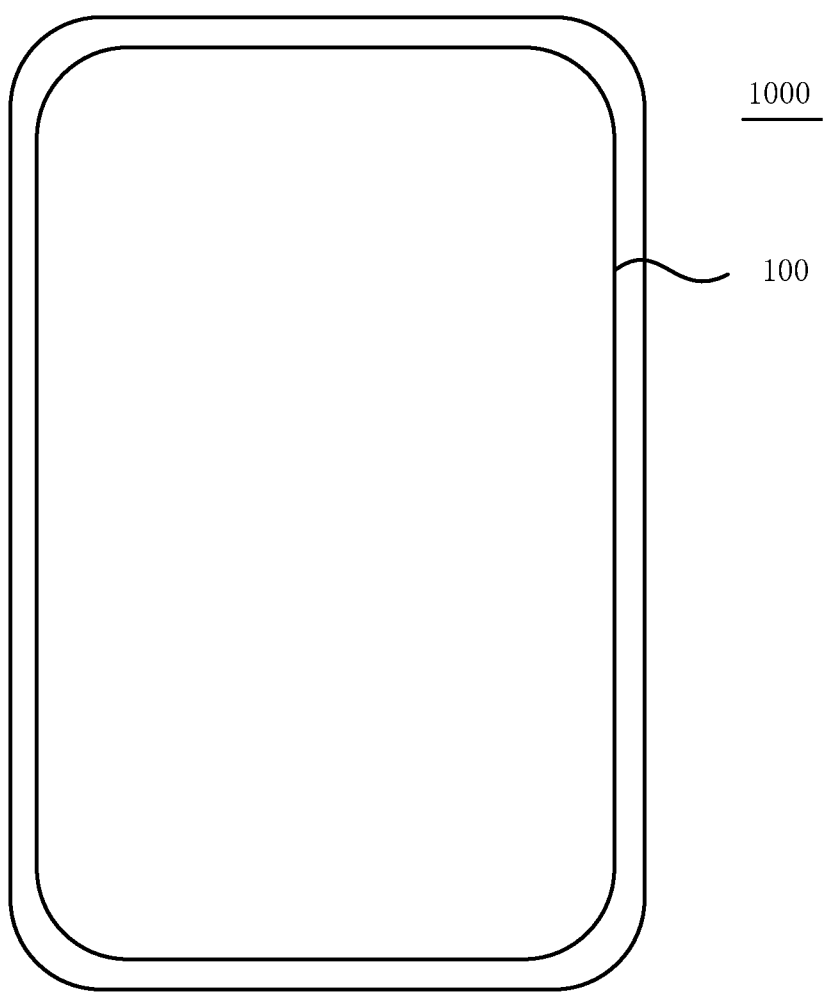
FIG. 20 illustrates a planar schematic of a display apparatus according to various embodiments of the present disclosure.

In some optional embodiments, referring to FIG. 20, FIG. 20 illustrates a planar schematic of a display apparatus according to various embodiments of the present disclosure. A display device 1000 provided in one embodiment may include the display panel 100 provided in above-mentioned embodiments of the present disclosure. A mobile phone may be used as an example to illustrate the display device 1000 in FIG. 20. It can be understood that the display device 1000 provided in above-mentioned embodiments of the present disclosure may also be a computer, a television, a vehicle-mounted display device, and another display device 1000 having a display function, which may not be limited in the present disclosure. The display device 1000 provided by above-mentioned embodiments of the present disclosure may have the beneficial effects of the display panel 100 provided by above-mentioned embodiment of the present disclosure. Details may refer to the description of the display panel 100 in above-mentioned embodiments, which may not be described in detail herein in one embodiment.

It can be known from above-mentioned embodiments that the display panel and the formation method thereof, and the display device provided by the present disclosure may at least achieve the following beneficial effects.

The formation method of the display panel provided in above-mentioned embodiments of the present disclosure may be described as the following. The base substrate may be provided. The array layer and the light-emitting structure layer may be sequentially formed on the side of the base substrate. The light-emitting structure layer may include the plurality of light-emitting units. The light-blocking layer may be formed on the side of the light-emitting structure layer away from the base substrate. The light-blocking layer may include the black matrix and the plurality of openings; the black matrix may be the grid-like structure surrounding the plurality of openings, and the openings may have a one-to-one correspondence with the light-emitting units; and the vertical projection of the opening on the base substrate may overlap the vertical projection of the light-emitting unit corresponding to the opening on the base substrate. Before forming the light-blocking layer on the side of the light-emitting structure layer away from the base substrate, the first inorganic layer may be formed on the side of the light-emitting structure layer away from the base substrate. The first inorganic layer may include the first sub-portions.

The vertical projection of the first sub-portion on the base substrate may overlap the vertical projection of the opening in the light-blocking layer on the base substrate. The black matrix with the grid structure surrounding the plurality of openings may be formed in the light-blocking layer, which may be that the black photosensitive resin layer may be coated on the surface of the first inorganic layer on the side away from the base substrate, and the black matrix with the grid structure surrounding the plurality of openings may be formed by exposure and development. The vertical projection of the first sub-portion on the base substrate overlaps the vertical projection of the opening in the light-blocking layer on the base substrate, that is, the portion of the black photosensitive resin layer where the opening is subsequently formed may be attached to the first sub-portion. Therefore, the first sub-portion, made of inorganic material, may have a relatively small adhesion with the black photosensitive resin material, which may effectively avoid the problem that the portion of the black photosensitive resin layer for subsequently forming the opening cannot be completely removed in the subsequent development process, and the black photosensitive resin material portion may partially remain in the opening. Therefore, the black photosensitive resin material remaining in the opening may be prevented from affecting the subsequent manufacturing process, and the display quality of the display panel may be effectively improved.

Although some embodiments of the present disclosure have been described in detail through examples, those skilled in the art should understand that the above-mentioned embodiments are only for illustration and not for limiting the scope of the present disclosure. Those skilled in the art should understand that the above-mentioned embodiments may be modified without departing from the scope and spirit of the present disclosure. The scope of the present disclosure may be defined by the appended claims.

What is claimed is:

1. A display panel, comprising:
a base substrate;
an array layer, on a side of the base substrate;
a light-emitting structure layer, on a side of the array layer away from the base substrate, wherein the light-emitting structure layer includes a plurality of light-emitting units;
a first inorganic layer, on a side of the light-emitting structure layer away from the base substrate;
a light-blocking layer, on a side of the first inorganic layer away from the base substrate,
wherein:
the light-blocking layer includes a black matrix and a plurality of openings;
the black matrix is a grid-like structure surrounding the plurality of openings;
the plurality of openings has a correspondence with the plurality of light-emitting units;
a vertical projection of the plurality of openings on the base substrate overlaps a vertical projection of the plurality of light-emitting units corresponding to the plurality of openings on the base substrate;
the first inorganic layer at least includes first sub-portions;
a vertical projection of a first sub-portion on the base substrate overlaps a vertical projection of a corresponding opening on the base substrate; and
color filter parts, at least partially filling the openings, wherein the first sub-portions directly contact with the color filter parts.

2. The display panel according to claim 1, further comprising:
a touch layer, wherein:
the touch layer is on the side of the light-emitting structure layer away from the base substrate; and
the first inorganic layer is on a side of the touch layer away from the base substrate.

3. The display panel according to claim 2, wherein:
the first inorganic layer further includes second sub-portions; and
a vertical projection of a second sub-portion on the base substrate overlaps a vertical projection of the black matrix on the base substrate.

4. The display panel according to claim 3, wherein:
the touch layer includes a first touch electrode layer, a first passivation layer, and a second touch electrode layer that are sequentially formed on the side of the light-emitting structure layer away from the base substrate; and the first inorganic layer is formed on a side of the second touch electrode layer away from the base substrate; or
the touch layer includes a first touch electrode layer, a first passivation layer, a second touch electrode layer, and a planarization layer that are sequentially formed on the side of the light-emitting structure layer away from the base substrate; and the first inorganic layer is formed on a side of the planarization layer away from the base substrate.

5. The display panel according to claim 1, wherein:
the plurality of light-emitting units includes a red light-emitting unit, a green light-emitting unit, and a blue light-emitting unit; and at least a first sub-portion corresponding to the blue light-emitting unit is filled with scattering particles; or
the first sub-portions are all filled with scattering particles; and a density of the scattering particles in the first sub-portion corresponding to the blue light-emitting unit is greater than a density of scattering particles in a first sub-portion corresponding to the green light-emitting unit and greater than a density of scattering particles in a first sub-portion corresponding to the red light-emitting unit.

6. The display panel according to claim 5, wherein:
along a direction from the base substrate to a light-exiting surface of the display panel, the density of the scattering particles in the first sub-portion corresponding to the blue light-emitting unit gradually increases.

7. A display apparatus, comprising:
a display panel, comprising:
a base substrate;
an array layer, on a side of the base substrate;
a light-emitting structure layer, on a side of the array layer away from the base substrate, wherein the light-emitting structure layer includes a plurality of light-emitting units;
a first inorganic layer, on a side of the light-emitting structure layer away from the base substrate;
a light-blocking layer, on a side of the first inorganic layer away from the base substrate,
wherein:
the light-blocking layer includes a black matrix and a plurality of openings;
the black matrix is a grid-like structure surrounding the plurality of openings;
the plurality of openings has a correspondence with the plurality of light-emitting units;

a vertical projection of the plurality of openings on the base substrate overlaps a vertical projection of the plurality of light-emitting units corresponding to the plurality of openings on the base substrate;

the first inorganic layer at least includes first sub-portions;

a vertical projection of a first sub-portion on the base substrate overlaps a vertical projection of a corresponding opening on the base substrate; and color filter parts, at least partially filling the openings, wherein the first sub-portions directly contact with the color filter parts.

8. A display panel, comprising:

a base substrate;

an array layer, on a side of the base substrate;

a light-emitting structure layer, on a side of the array layer away from the base substrate, wherein the light-emitting structure layer includes a plurality of light-emitting units;

a first inorganic layer, on a side of the light-emitting structure layer away from the base substrate; and a light-blocking layer, on a side of the first inorganic layer away from the base substrate, wherein the light-blocking layer includes a black matrix and a plurality of openings; the black matrix is a grid-like structure surrounding the plurality of openings; the plurality of openings has a correspondence with the plurality of light-emitting units; and a vertical projection of the plurality of openings on the base substrate overlaps a vertical projection of the plurality of light-emitting units corresponding to the plurality of openings on the base substrate, wherein:

the first inorganic layer at least includes second sub-portions; and a vertical projection of a second sub-portion on the base substrate overlaps a vertical projection of the black matrix on the base substrate; wherein the second sub-portion directly contacts with the black matrix.

9. The display panel according to claim 8, further comprising:

a touch layer, the touch layer is on the side of the light-emitting structure layer away from the base substrate;

wherein the first inorganic layer is located between the touch layer and the black matrix.

10. The display panel according to claim 9, wherein:

the touch layer includes a first touch electrode layer, a first passivation layer, and a second touch electrode layer that are sequentially formed on the side of the light-emitting structure layer away from the base substrate; and the first inorganic layer is formed on a side of the second touch electrode layer away from the base substrate; or the touch layer includes a first touch electrode layer, a first passivation layer, a second touch electrode layer, and a planarization layer that are sequentially formed on the side of the light-emitting structure layer away from the base substrate; and the first inorganic layer is formed on a side of the planarization layer away from the base substrate.

11. The display panel according to claim 8, wherein:

the first inorganic layer includes first sub-portions; and a vertical projection of a first sub-portion on the base substrate overlaps a vertical projection of a corresponding opening on the base substrate; and the display panel further comprises color filter parts, at least partially filling the openings, wherein the first sub-portions directly contact with the color filter parts.

12. The display panel according to claim 9, wherein:

the touch layer includes a first touch electrode layer, a first passivation layer, and a second touch electrode layer that are sequentially formed on the side of the light-emitting structure layer away from the base substrate; and the first inorganic layer is formed on a side of the second touch electrode layer away from the base substrate; or the touch layer includes a first touch electrode layer, a first passivation layer, a second touch electrode layer, and a planarization layer that are sequentially formed on the side of the light-emitting structure layer away from the base substrate; and the first inorganic layer is formed on a side of the planarization layer away from the base substrate.

13. The display panel according to claim 8, wherein:

the plurality of light-emitting units includes a red light-emitting unit, a green light-emitting unit, and a blue light-emitting unit; and at least a first sub-portion corresponding to the blue light-emitting unit is filled with scattering particles; or the first sub-portions are all filled with scattering particles; and a density of the scattering particles in the first sub-portion corresponding to the blue light-emitting unit is greater than a density of scattering particles in a first sub-portion corresponding to the green light-emitting unit and greater than a density of scattering particles in a first sub-portion corresponding to the red light-emitting unit; and along a direction from the base substrate to a light-exiting surface of the display panel, the density of the scattering particles in the first sub-portion corresponding to the blue light-emitting unit gradually increases.

14. A display device comprising the display panel of claim 8.

* * * * *